(12) United States Patent
Yamaoka et al.

(10) Patent No.: US 7,911,221 B2
(45) Date of Patent: Mar. 22, 2011

(54) SEMICONDUCTOR DEVICE WITH SPEED PERFORMANCE MEASUREMENT

(75) Inventors: Masanao Yamaoka, Kodaira (JP); Kenichi Osada, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/335,331

(22) Filed: Dec. 15, 2008

(65) Prior Publication Data

US 2009/0153182 A1    Jun. 18, 2009

(30) Foreign Application Priority Data

Dec. 17, 2007   (JP) ................................ 2007-324991

(51) Int. Cl.
*H03K 19/00* (2006.01)
(52) U.S. Cl. .................. 326/16; 326/12; 326/46; 326/93
(58) Field of Classification Search .............. 326/10–13, 326/16, 46; 327/200–218
See application file for complete search history.

(56) References Cited

U.S. PATENT DOCUMENTS

| | | | |
|---|---|---|---|
| 2003/0117853 A1 | 6/2003 | Mimura | |
| 2006/0220716 A1* | 10/2006 | Nicolaidis | 327/199 |
| 2007/0164787 A1* | 7/2007 | Grochowski et al. | 326/46 |
| 2007/0262787 A1* | 11/2007 | Chakraborty et al. | 326/16 |

FOREIGN PATENT DOCUMENTS

JP    2003-273234 A    9/2003

* cited by examiner

*Primary Examiner* — Rexford N Barnie
*Assistant Examiner* — Jany Tran
(74) *Attorney, Agent, or Firm* — Miles & Stockbridge P.C.

(57) ABSTRACT

A speed performance measurement circuit that may perform speed performance measurement is provided between a first logic circuit and a second logic circuit. The speed performance measurement circuit includes a first flip flop that stores first data, a first delay circuit that delays the first data and generates second data, and a second flip flop that stores the second data. Furthermore, the speed performance measurement circuit includes a first comparator circuit that compares output of the first flip flop to output of the second flip flop, and a third flip flop that stores output data from the first comparator circuit in accordance with timing of the first clock signal. Data in a normal path is compared to data in a path delayed by a certain time to measure speed, and power voltage of a circuit is determined based on such comparison. Thus, change in speed with respect to power voltage in a critical path can be measured.

12 Claims, 13 Drawing Sheets

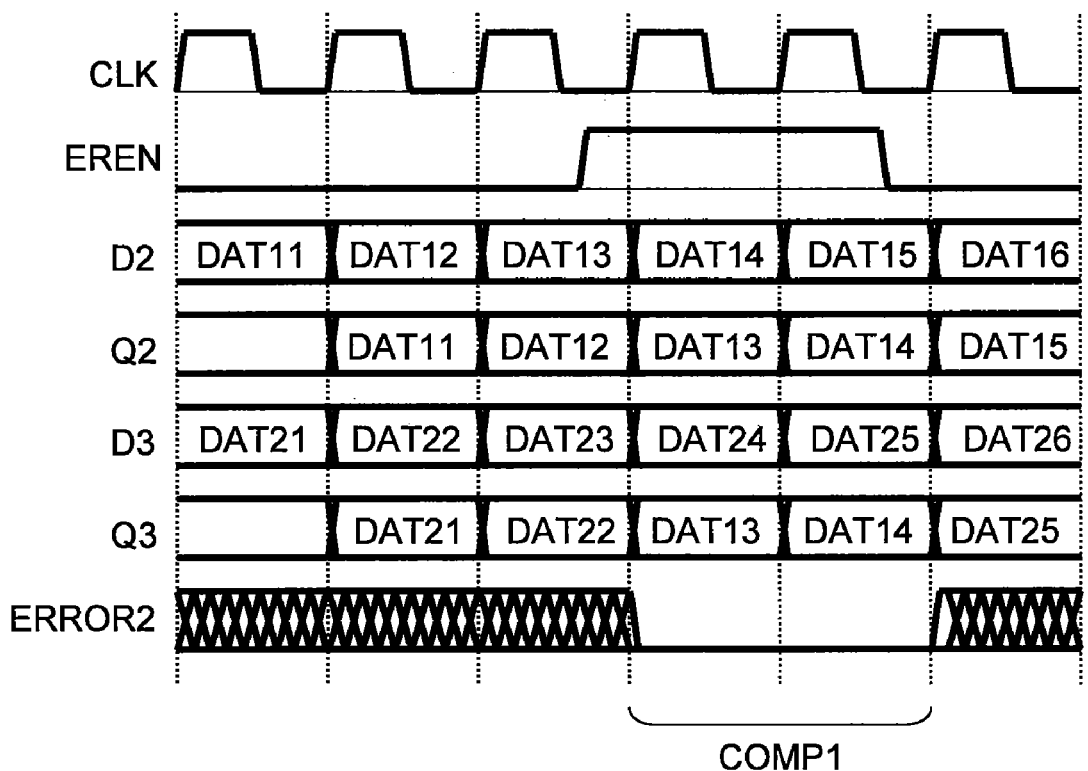
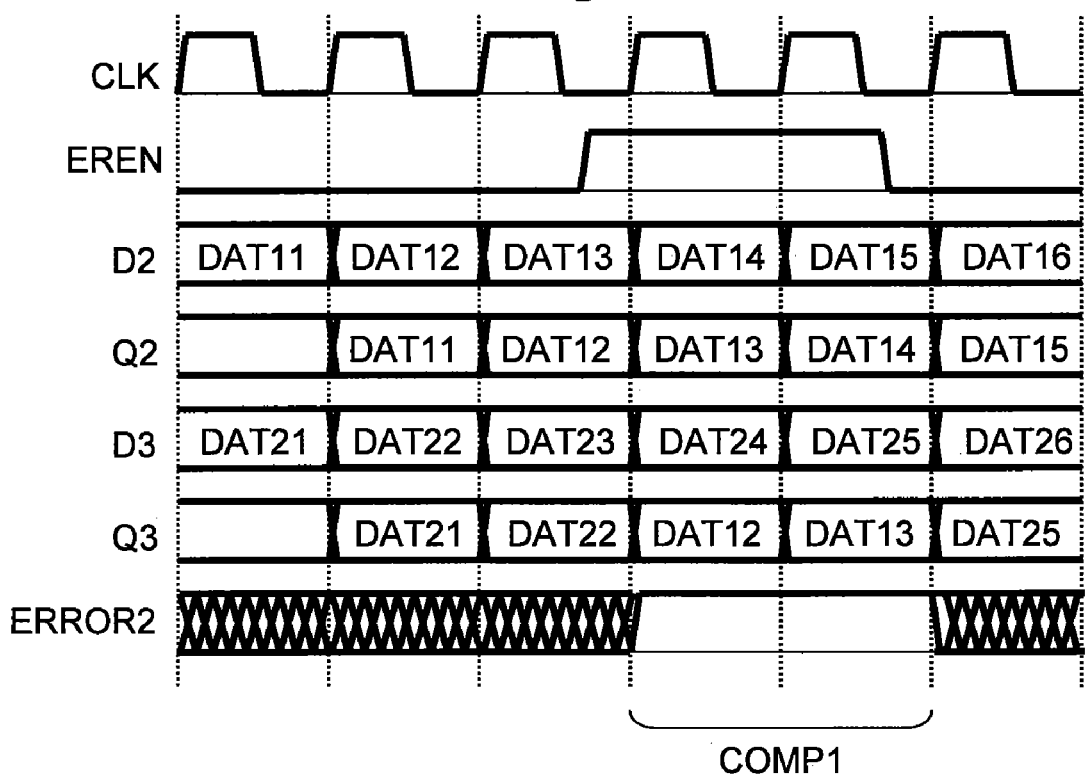

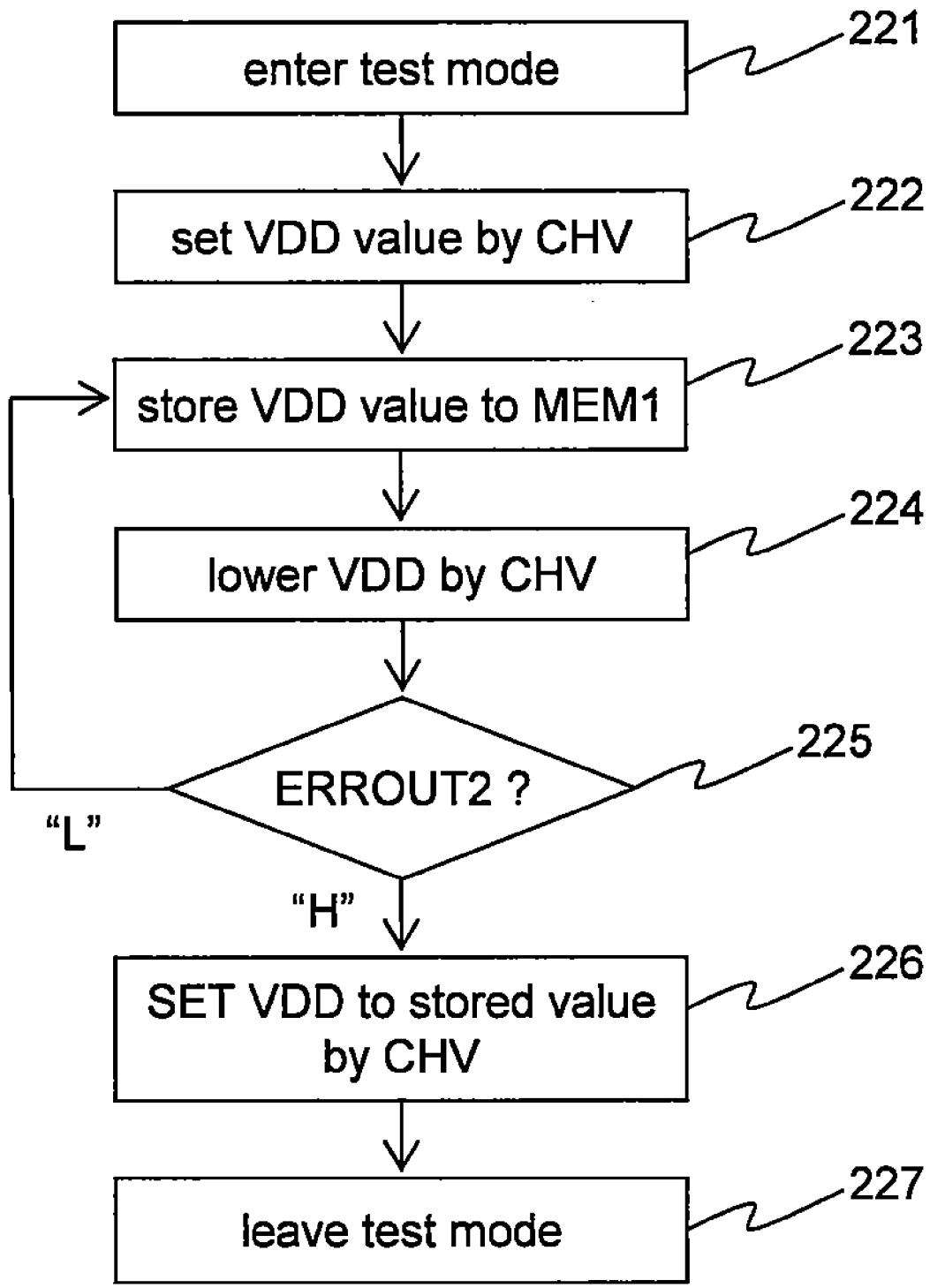

SEMICONDUCTOR DEVICE WITH SPEED PERFORMANCE MEASUREMENT

CLAIM OF PRIORITY

The Present application claims priority from Japanese application JP 2007-324991 filed on Dec. 17, 2007, the content of which is hereby incorporated by reference into this application.

BACKGROUND OF THE INVENTION

1. Field of the Invention

The present invention relates to a semiconductor device including a plurality of circuits for performing predetermined processing to an inputted signal, and furthermore relates to a circuit technique for reducing amount of margin, which is secured when a circuit is designed in order to allow circuit operation even if performance of a manufactured integrated-circuit is varied, so that a semiconductor chip may operate with optimum performance of the circuit.

2. Description of the Related Art

With progress of size reduction in semiconductor manufacturing process, variation is increased in threshold voltage (Vth) of a MOS transistor. When Vth of a manufactured MOS transistor is decreased due to variation in Vth, since a drive current of the MOS transistor is increased, operable operation speed of a circuit is increased. Conversely, when Vth of a manufactured MOS transistor is increased due to variation in Vth, since a drive current of the MOS transistor is decreased, operable operation speed of a circuit is decreased. When processing size is decreased to less than 90 nm in the semiconductor manufacturing process, difference in speed caused by variation is increased due to increase in variation of Vth, leading to difficulty in determination of operation speed of a circuit. Particularly, in case of using a technique called FV control in which each of operation frequency and power voltage of a circuit is changed depending on required performance of the circuit, since operable frequency of the circuit is different depending on power voltage, when the circuit is designed, operation frequency is hardly determined to meet any power voltage depending on variation. Therefore, when optimum operation frequency can be determined by measuring a characteristic of a manufactured circuit, performance of the manufactured circuit can be adequately used. For example, JP-A-2003-273234 describes a technique where timing of a clock inputted into a circuit is controlled to measure performance of the circuit.

SUMMARY OF THE INVENTION

With progress of a manufacturing process of LSI (Large Scale Integrated circuit), a transistor in LSI is progressively reduced in size. For example, a small transistor having a transistor gate length of 50 nm was mass-produced in 2006. A transistor is progressively reduced in size, which increases variation in Vth of the transistor, consequently Vth of a transistor configuring an actually manufactured circuit is greatly shifted from Vth of the transistor when designed. For example, in case that Vth of a manufactured transistor is higher than Vth of the transistor when designed, operation current of the transistor decreases, leading to reduction in operation speed. Particularly, in case of using the FV control technique, a power voltage required for operation of a circuit at a predetermined frequency needs to be accurately measured for each manufactured circuit, and a result of the measurement needs to be held in the circuit.

In the JP-A-2003-273234, two memory flip flops (FF) are provided, which are disposed in a path called critical path being slowest in signal transfer, timing of a clock for controlling respective FF is shifted between the flip flops, and contents of data held in the respective FF are compared to each other, thereby whether timing error occurs is measured. In such a case, power voltage is gradually decreased, and in case that occurrence of error is found from a result of the comparison between the FF, the power voltage is increased, so that a lower limit value of the power voltage is measured. However, in the JP-A-2003-273234, output Sig106 of a determiner 106 is directly inputted into a power voltage control circuit, and power voltage is adjusted in accordance with error determination of the output Sig106. Therefore, (1) in case that noise such as a glitch occurs in Sig106, it may be determined as error determination, and consequently even if a power voltage can be essentially lowered, the voltage is possibly increased. In addition, (2) control is performed in a way that when error occurs, power voltage is increased, and when error does not occur, the power voltage is decreased as shown in FIG. 9. Therefore, in such control, power voltage fluctuates at any time. In the JP-A-2003-273234, what degree of pitch is used for changing the power voltage is not known. In case that the pitch is small, since a fluctuation area is small, any problem may not particularly occur. However, in case that the pitch is small, the power voltage hardly reaches the lower limit value unless the control is performed many times, therefore much time is possibly required for control. On the other hand, in case that the pitch is made large in order to fast reach the lower limit value, operation speed is greatly affected by the pitch, thereby stable operation of a circuit, being essentially intended, may not be performed. Moreover, in case that the lower limit value of power voltage is measured, if a prior state of a circuit is not kept in case that the power voltage is gradually changed, a minimum power voltage value above which no error occurs cannot be measured when timing error occurs. Furthermore, (3) a configuration is used, in which an arithmetic circuit group 203 performing normal operation outputs data for error determination, in addition, error determination is performed in each clock cycle. In case that error determination is performed in each clock cycle, data in F/F need to be inverted. Therefore, the technique is hard to be used for portions other than a portion where data outputted from a typical logic circuit unit is changed in logical value between "1" and "0" in each clock cycle. Finally, (4) when a circuit is designed, a path being slowest in signal transfer has been able to be estimated in the past. However, in a circuit manufactured by a current, fine semiconductor manufacturing process, since variation in Vth of a MOS transistor is increased, a plurality of paths (critical paths) being slowest in signal transfer are considered to exist, therefore a plurality of paths to be measured in timing are necessary. In JP-A-2003-273234, since F/F for error determination is additionally provided, if the technique is used for a plurality of paths, circuit scale is increased.

The foregoing and other objects and novel features of the invention will be clarified from description of the specification and accompanying drawings.

A typical invention among inventions disclosed in the application is briefly described as follows.

That is, a speed performance measurement circuit that may measure speed performance is provided between a first logic circuit and a second logic circuit. The speed performance measurement circuit includes a first flip flop that stores first data inputted in synchronization with a first clock signal, a first delay circuit that delays the first data and generates second data, a second flip flop that stores the second data inputted in synchronization with the first clock signal, a first comparator circuit that compares output of the first flip flop to output of the second flip flop, and a third flip flop that stores data of an output signal from the first comparator circuit in accordance with timing of the first clock signal. A measurement result of change in speed with respect to power voltage in a critical path is obtained from output of the third flip flop.

An advantage obtained by a typical invention among inventions disclosed in the application is briefly described as follows.

That is, change in speed with respect to power voltage in a critical path can be measured.

BRIEF DESCRIPTION OF THE DRAWINGS

FIG. 16 shows an operation timing chart of a major part of the circuit shown in FIG. 15;

FIG. 17 shows another operation timing chart of the major part of the circuit shown in FIG. 15;

FIG. 18 shows a flowchart showing a sequence of setting of power voltage in the circuit shown in FIG. 15;

DETAILED DESCRIPTION OF THE PREFERRED EMBODIMENTS

1. Summary of the Preferred Embodiments

Figure 1:
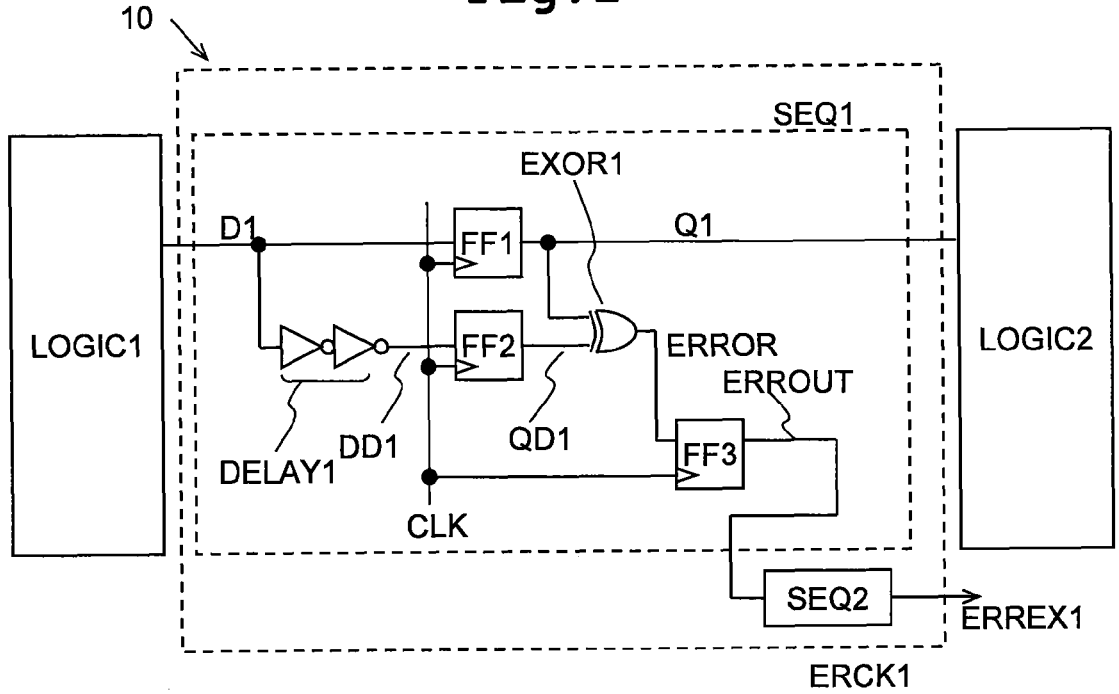
FIG. 1 shows a circuit diagram of a configuration example of a major part of SOC as an example of a semiconductor device according to the invention.

First, summary of a typical embodiment of the invention disclosed in the application is described. A reference sign in a drawing, which is seen with a bracket in description of the summary of the typical embodiment, merely exemplifies contents included in concept of a component marked with the sign.

[1] A semiconductor device (SOC1 or SOC2) according a typical embodiment of the invention includes a first logic circuit (LOGIC1); a second logic circuit (LOGIC2) that is disposed in a subsequent stage of the first logic circuit, and transmitted with first data outputted from the first logic circuit; and a speed performance measurement circuit (SEQ1) that may perform speed performance measurement between the first logic circuit (LOGIC1) and the second logic circuit (LOGIC2). The speed performance measurement circuit includes a first flip flop (FF1) that stores the first data in synchronization with a clock signal; a first delay circuit (DELAY1) that delays the first data and generates second data; a second flip flop (FF2) that stores the second data in synchronization with the clock signal; a comparator circuit (EXOR1) that compares output of the first flip flop to output of the second flip flop, and a third flip flop (FF3) that stores data of an output signal from the comparator circuit in accordance with timing of the first clock signal.

[2] Each part may include a voltage source (VGEN1) for generating power voltage for operation, and a voltage control circuit (CONTV) that may adjust the power voltage by using output data from the comparator circuit.

[3] The semiconductor device may include a memory circuit (MEM1) that may hold control information of the power voltage, wherein the voltage control circuit refers to the control information in the memory circuit for adjusting the power voltage.

[4] The semiconductor device may include a fourth flip flop (FF4), wherein in case that output logic of the first comparator circuit is turned to a high level, the fourth flip flop accordingly keeps an output state at a high level for a certain time.

[5] The semiconductor device may include a resource manager (RM) for managing a resource of a circuit module (CPU1 or CPU2) having a predetermined function, wherein the power voltage is adjusted depending on resource management of the circuit module performed by the resource manager.

[6] When a plurality of the speed performance measurement circuits (SEQ1) are provided, a speed performance measurement result output unit (SEQ3) may be provided for collecting output signals from the plurality of speed performance measurement circuits into one signal. In this case, the speed performance measurement result output unit may be configured to include an OR circuit (OR1) for collecting output signals from the plurality of speed performance measurement circuits into one signal by obtaining OR logic between the output signals from the plurality of speed performance measurement circuits, and a fifth flip flop circuit (FF5) for holding an output signal from the OR circuit in synchronization with the clock signal.

[7] Moreover, the speed performance measurement result output unit may include a second delay circuit (DELAY2) for delaying the clock signal; a plurality of first transistors (MN2 and MN3) that are disposed corresponding to the plurality of the speed performance measurement circuits, and load output signals from the respective, corresponding speed performance measurement circuits; a second MOS transistor (MP1) that is controlled in operation by an output signal from the delay circuit, and couples drain electrodes of the plurality of first transistors to a power supply at a high potential side; a third MOS transistor (MN1) that is controlled in operation by an output signal from the second delay circuit, and couples source electrodes of the plurality of first transistors to a power supply at a low potential side; and a sixth flip flop circuit (FF5) that may hold logic of the drain electrodes of the plurality of first transistors in synchronization with the clock signal.

[8] The semiconductor device may include a frequency control circuit (CONTF) that may control frequency of the clock signal based on output data from the first comparator circuit.

[9] The semiconductor device may include a clock generation circuit (PLL) that generates the clock signal, and may change frequency of the clock signal based on an output signal from the frequency control circuit.

[10] The semiconductor device may include a body bias adjustment circuit (CONTVB) that adjusts body bias of a transistor by using output data from the comparator circuit.

[11] The semiconductor device may include a memory circuit (MEM3) that holds control information of body bias, wherein the body bias adjustment circuit refers to the control information in the memory circuit for adjusting body bias of the transistor.

[12] From a different viewpoint, a semiconductor device may include a first flip flop (FF7) that stores first data in accordance with timing of a clock signal; a first delay circuit (INV10 or INV11) that delays the first data and generates second data; a first selection circuit (INV12 or INV13) that selectively outputs a third data, which are inputted through a different path from a path of the first data, and the second data; a second flip flop (FF8) that stores an output signal from the first selection circuit in accordance with timing of the clock signal; and a comparator circuit (EXOR2) that compares output of the first flip flop to output of the second flip flop.

[13] The semiconductor device may be configured such that when a first mode for measuring speed performance, and a second mode other than the first mode are included, the second flip flop is inputted with the third data in the second mode, and inputted with the second data in the first mode according to selection operation of the first selection circuit.

[14] The semiconductor device may include a third flip flop (FF11) that stores output of the second comparator circuit in synchronization with timing of the clock signal.

[15] From a still different viewpoint, a semiconductor device may include a seventh flip flop (FF7) that stores inputted, sixth data in synchronization with timing of a clock signal; a first delay circuit (INV10 or INV11) that delays the first data and generates second data; a first selection circuit (INV12 or INV23) that selectively outputs the second data and output of the first flip flop; a second flip flop (FF8) that stores an output signal from the first selection circuit in accordance with timing of the clock signal; and a comparator circuit (EXOR2) that compares output of the first flip flop to output of the second flip flop.

[16] The semiconductor device may include a second selection circuit (INSEL3) that may input data in the second flip flop into the first flip flop.

[17] The semiconductor device may be configured such that when a circuit is in a standby state, supply of power voltage is broken to the first flip flop, the third delay circuit, the second selection circuit, and the comparator circuit, and the second flip flop is supplied with a signal having a power voltage level.

2. Further Detailed Description of the Preferred Embodiments

Next, preferred embodiments are described further in detail.

Embodiment 1

Figure 8:
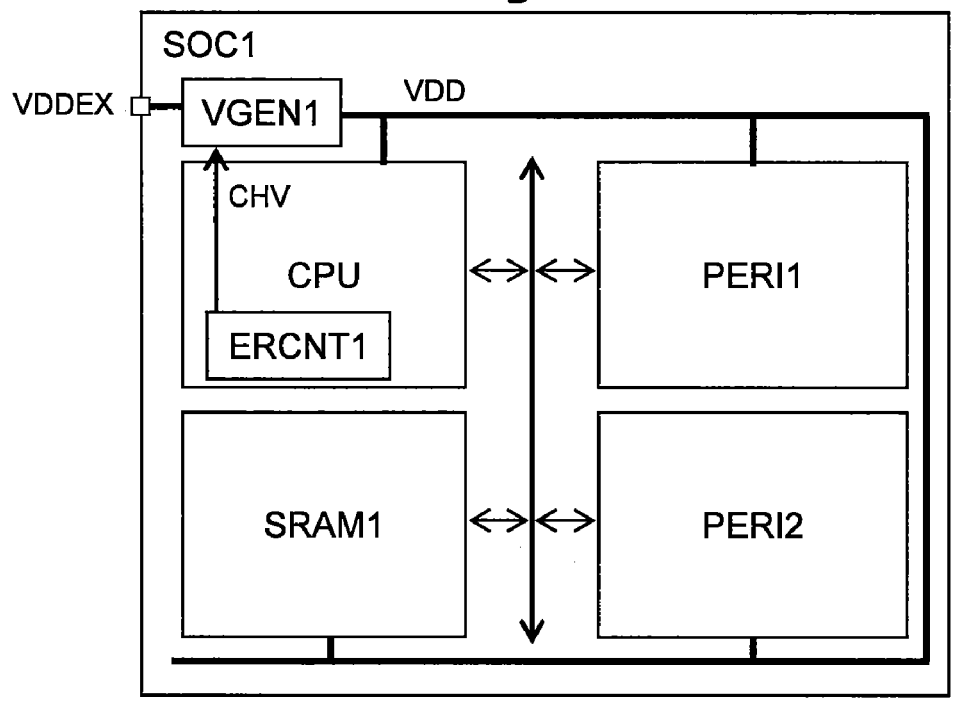
FIG. 8 shows a block diagram of a configuration example of SOC as an example of the semiconductor device according to the invention.

FIG. 8 shows SOC (System On a Chip) 1 as an example of a semiconductor device according to the invention. The SOC1 shown in FIG. 8 includes CPU, PERI1, PERI2, SRAM1 and VGEN1, and formed on one semiconductor substrate such as a single crystal silicon substrate by a known semiconductor integrated-circuit manufacturing technique. CPU is a central processing unit, and performs general-purpose processing according to a predetermined program, and controls operation of each unit. The PERI1 and PERI2 are accelerators, and perform particular processing respectively. The SRAM1 is a memory block used as a main memory. VGEN1 is a voltage source that generates operation power voltage VDD for each unit of the SOC1. CPU includes a voltage control circuit (ERCNT1) which measures operation speed of CPU, and sets a minimum power voltage corresponding to performance of the operation speed in VGEN1. Thus, a power voltage can be set, at which SOC1 as a whole may achieve certain speed performance, so that the minimum power voltage can be set, and thus operation power is minimized while performance required for LSI is secured.

Figure 4:
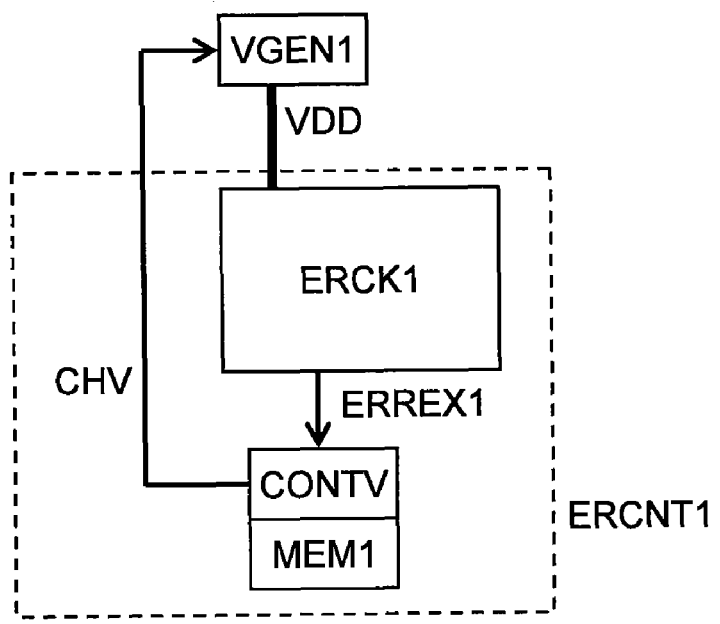
FIG. 4 shows a block diagram of a configuration example of a major part of SOC as the example of the semiconductor device according to the invention.

FIG. 4 shows a configuration example of the ERCNT1.

In FIG. 4, VGEN1 is a power voltage generator, CONTV is a power voltage control circuit, and MEM1 is a memory circuit storing control information of power voltage. ERCK1 is an error check circuit, and ERCN is an error control circuit. VDD is power voltage, CHV is a signal specifying power voltage, and ERROUT is an output signal from a circuit measuring speed performance. In the circuit, the minimum power voltage for operation can be set by the ERROUT signal outputted from the circuit measuring speed performance.

Figure 5:
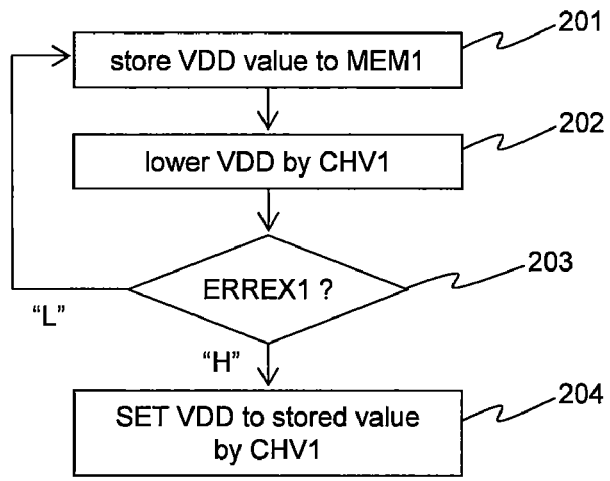
FIG. 5 shows a flowchart showing a sequence of setting of power voltage according to the configuration shown in FIG. 4.

FIG. 5 shows a sequence of setting of power voltage in the circuit.

In FIG. 5, in step 201, a value of current power voltage is stored in MEM 1 in FIG. 4. In step 202, power voltage is lowered. In step 203, data of ERROUT are subjected to comparison. In case that a high (H) level is outputted based on the comparison, processing of step 204 is performed. In case that a low (L) level is outputted, operation of the step 201 is performed. In the step 204, control information of power voltage is set in MEM1. Power voltage is controlled according to the set control information. Operation from steps 201 to 204 is performed, enabling setting of a minimum power voltage for operation of a circuit at a certain operation speed. In the power voltage setting sequence of FIG. 5, whether ERROUT is "H" or "L" is determined in the step 203. In this way, the memory circuit (MEM1) is provided for storing power voltage information, and only in case that error does not occur, the power voltage information is changed, and when error occurs, the power voltage is reset to a prior value when error did not occur. Thus, a lower limit of power voltage can be set, and consequently the problem (2) can be solved.

FIG. 1 shows a configuration example of the ERCK1.

The ERCK1 is disposed between LOGIC1 and LOGIC2 as shown in FIG. 1. Each of LOGIC1 and LOGIC2 is a combinational logic circuit that may perform predetermined logic operation.

An output signal from LOGIC1 is transmitted to LOGIC2 disposed in a later stage via ERCK1. ERCK1 performs measurement of speed performance of a critical path from the LOGIC1 to the LOGIC2, and performs error check based on a result of the speed performance measurement. While not particularly limited, a result of the error check is used for power voltage control described later.

The ERCK1 includes a speed performance measurement circuit (SEQ1) that may perform measurement of speed performance of the critical path, and an error determination circuit (SEQ2) that performs error determination based on a result of measurement (ERROUT) by the SEQ1. An error determination signal ERREX1 is outputted from the SEQ2.

While not particularly limited, the SEQ1 includes a delay circuit (DELAY1), flip flop circuits (FF1, FF2 and FF3), and an exclusive-OR circuit (EXOR1). The DELAY1 is configured by two stages of inverters. An output signal D1 from the LOGIC1 is subjected to signal delay by time corresponding to two stages of inverters due to the DELAY1. An output signal DD1 from the DELAY1 is transmitted to FF2. FF1 holds the output signal D1 from the LOGIC1 in synchronization with a clock signal CLK. FF2 holds the output signal DD1 from the DELAY1 in synchronization with the clock signal CLK. EXOR1 obtains exclusive-OR logic between output signals from the FF1 and FF2. A result of the exclusive-OR logic ERROR is held by FF3 in synchronization with the clock signal CLK. An output signal ERROUT from FF3 is transmitted to SEQ2 in a subsequent stage. In this way, FF3 is provided, which loads the output ERROR from EXOR1 being a comparator circuit in accordance with the clock signal CLK inputted into each of FF1 and FF2. Thus, even if noise such as a glitch occurs in ERROR, the noise may be neglected, and thus information of the comparison result ERROR can be accurately held, and consequently the problem (1) can be solved.

The power voltage control circuit CONTV and the memory circuit MEM1 shown in FIG. 4 may operate as a trigger for directly changing power voltage information by the ERROR signal while FF3 is not provided. However, the circuits are particularly effective in combination with FF3 in FIG. 1. That is, when ERROR is directly used as a trigger for changing power voltage information in the memory circuit while FF3 does not exist, the power voltage information may be falsely changed due to noise such as a glitch. Therefore, error information held by FF3 is accurately obtained, thereby stable operation can be performed.

In the circuit shown in FIG. 1, while not shown, a flip flop circuit operating upon a clock signal CLK is disposed in a prior stage of LOGIC1, and data are inputted into the LOGIC1 upon input of the clock signal CLK, and output of the LOGIC1 is stored into FF1 in synchronization with a subsequent clock signal CLK. In the circuit, in case that delay of LOGIC1 moves at a speed higher than frequency given by the clock signal CLK by at least delay of two stages of inverters, the output signal ERROUT from FF3 has a low level. However, when the delay of the combinational logic circuit LOGIC1 moves at a speed approximately equal to speed of the frequency given by the clock signal CLK, or lower than the frequency speed, a high-level signal is outputted as the output signal ERROUT from FF3.

Next, operation of the SEQ1 is described.

Figure 2:
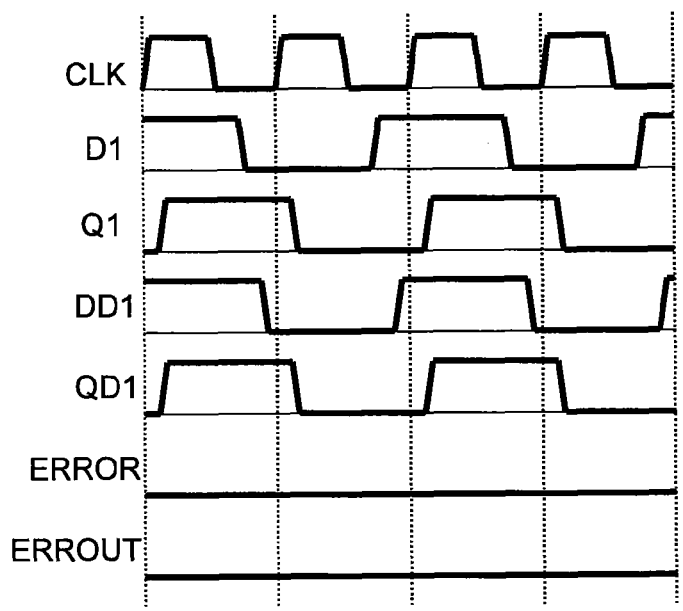
FIG. 2 shows an operation timing chart of a major part of a circuit shown in FIG. 1.

FIG. 2 shows an operation waveform of each circuit unit in FIG. 1 in case that delay of LOGIC1 moves at a speed higher than speed of the frequency given by the clock signal CLK by at least delay of two stages of inverters.

A cyclical clock signal CLK is inputted into LOGIC1, and data of the output signal D1 from LOGIC1 are changed in level before rising of the clock. Then, since the clock signal CLK is inputted into FF1, a value of the output signal D1 from LOGIC1 is loaded into FF1 and outputted as a signal, and the outputted signal is inputted into LOGIC2 in a subsequent stage. Moreover, data of the signal DD1, the signal being given by delaying the output signal D1 from LOGIC1 by delay of two stages of inverters, are also changed in level before rising of the clock signal CLK. Therefore, data are loaded into FF2 inputted with the output signal DD1 from DELAY1 at the same time with rising of the clock signal CLK, and the data are outputted as QD1. In this case, since data loaded into each of FF1 and FF2 respectively are the same, Q1 and QD1 being output signals from FF1 and FF2 have the same value, and the signal ERROR obtained by exclusive-OR between Q1 and QD1 has a low level. Furthermore, output of FF3 loading such a signal ERROR has a low level.

Figure 3:
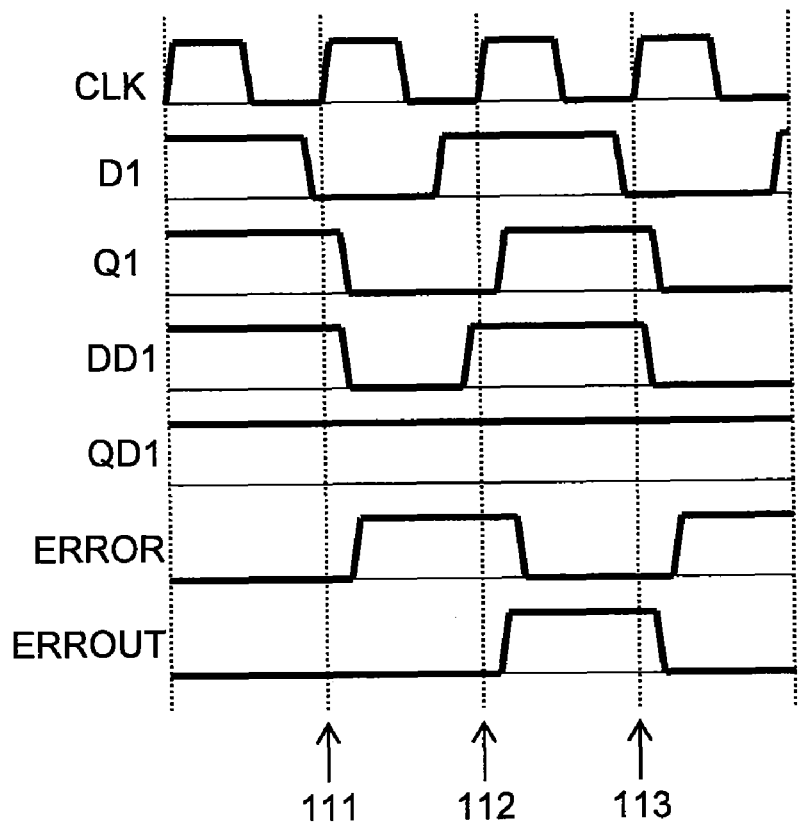
FIG. 3 shows another operation timing chart of the major part of the circuit shown in FIG. 1.

FIG. 3 shows a case where time given by adding the delay of LOGIC1 to the delay of the two stages of inverters is longer than a cycle time of the clock signal CLK, that is, shows an operation waveform of each circuit unit in FIG. 1 in case that operation speed of LOGIC1 has substantially no margin.

In a case of an operation example shown in FIG. 3, delay of LOGIC1 moves slow compared with the case of FIG. 2. Therefore, at timing 111, while data of the output signal D1 from LOGIC1 have been changed in level, data of the output signal DD1 from DELAY1 are not changed. Therefore, input data into FF1 is turned to a low level at rising of the clock signal CLK at the timing 111, and therefore the output signal Q1 from FF1 is also turned to a low level. On the other hand, data into FF2 is turned to a high level, and the output signal QD1 from FF2 is also turned to a high level. Accordingly, the value of exclusive-OR ERROR between the signals Q1 and QD1 has a high level. Furthermore, at timing 112 corresponding to rising of a subsequent clock signal CLK, output of EXOR1 is held by FF3, and the signal ERROUT is turned to a high level. Furthermore, at timing 113 corresponding to rising of a next subsequent clock signal CLK, since the output signal Q1 from FF1 is equal in level to the output signal QD1 from FF2, the value of exclusive-OR ERROR is turned to a low level, and data loaded into FF3 is also turned to a low level. In this way, when the circuit shown in FIG. 1 is used, detection can be made on a fact that a speed value of delay of the LOGIC1 is close to that of the frequency given by the clock signal CLK.

However, in SEQ1 shown in FIG. 1, the cyclical ERROUT is not outputted at a speed-error occurring condition. This is because SEQ1 shown in FIG. 1 compares data between FF1 and FF2 when data are changed, and detects whether data are different between them, therefore when data inputted into FF3 are not changed, even if speed error occurs, the signal ERROUT is not turned to a high level.

Thus, in the example, the error determination circuit SEQ2 is disposed in a subsequent stage of the speed performance measurement circuit SEQ1, which enables error determination of whether output ERROUT from the flip flop circuit FF3 is turned to a high level during several cycles.

Figure 6:
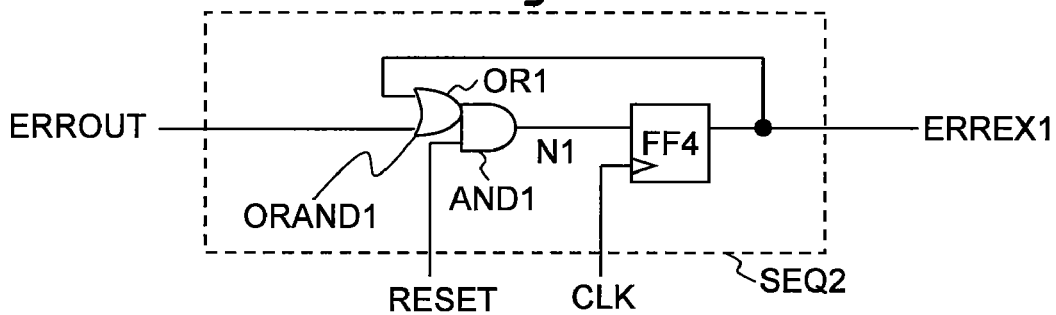
FIG. 6 shows a circuit diagram of a configuration example of a major part of the circuit shown in FIG. 1.

FIG. 6 shows a configuration example of the SEQ2.

While not particularly limited, SEQ2 includes a logic circuit (ORAND1) and a flip flop circuit (FF4) as shown in FIG. 6. ORAND1 includes an OR circuit (OR1) that calculates the logical sum of an output signal ERROUT from FF3 and an output signal ERREX1 from FF4, and an AND circuit (AND1) that calculates the logical multiplication of an output signal from the OR1 and a reset signal RESET, the signals being coupled with each other. An output signal N1 from the ORAND1 is transmitted to FF4 in a subsequent stage.

Figure 7:
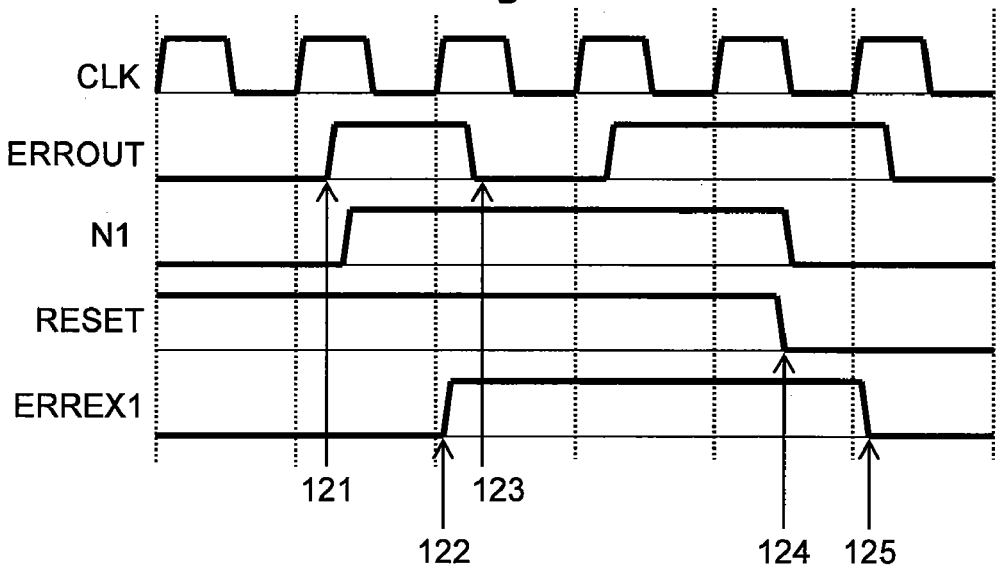
FIG. 7 shows an operation timing chart of a major part of the circuit shown in FIG. 6.

FIG. 7 shows operation timing of a major part of the SEQ2 shown in FIG. 6.

A clock signal CLK is cyclically inputted. An initial state shows a state after a reset signal is once turned to a low level, wherein an output signal ERREX1 from FF4 has a low level. At time 121, when high-level data are inputted into an output signal ERROUT from FF3, an output signal N1 from ORAND1 is turned to a high level, and at time 122, the high-level data are stored into FF4, and the output ERREX1 is turned to a high level. At time 123, while low-level data are inputted into the output signal ERROUT from FF3, the output signal ERREX1 from FF4 still keeps the high level. At time 124, a reset signal RESET is turned to a low level, and SEQ2 is reset. Then, at time 125, the low-level data are held by FF4, and the output ERREX1 is also turned to a low level. In this way, the circuit SEQ2 shown in FIG. 6 is provided, which enables storing a fact that high-level data are inputted from the output signal ERROUT of FF3. Consequently, SEQ2 is disposed in the subsequent stage of SEQ1, enabling error determination of whether the output ERROUT from FF3 is turned to a high level during several cycles. That is, according to the configuration, if error determination is made even once during a plurality of clock cycles (a period before a reset signal is inputted), error determination data are held by FF4. That is, an error determination circuit can be provided even if it is not subsequent to a logic circuit that alternately outputs "H" and "L", and thus the problem (3) can be solved. In addition, FF4 has the same advantage as FF3. That is, even if noise such as a glitch occurs in ERROR or ERROUT, since FF4 loads data according to the same clock signal as in FF1 or FF2, stable operation can be achieved.

According to the example, the following operation and effects can be obtained.

(1) FF1 that stores a first data inputted in synchronization with a clock signal CLK, FF2 that delays the first data and generates second data, FF3 that stores the second data inputted in synchronization with the clock signal CLK, EXOR1 that compares output of the FF1 to output of the FF2, and FF4 that stores data of an output signal from the EXOR1 according to timing of the clock signal CLK are provided, whereby it can be detected without being affected by noise that delay of the combinatorial logic circuit LOGIC1 has a speed value close to that of the frequency given by the clock signal CLK.

(2) SEQ2 is disposed in the subsequent stage of SEQ1, which enables error determination of whether the output ERROUT from FF3 is turned to a high level during several cycles.

(3) The operation and effects of (1) and (2) enable setting of the minimum power voltage while securing required speed performance in SOC1.

Embodiment 2

Figure 9:
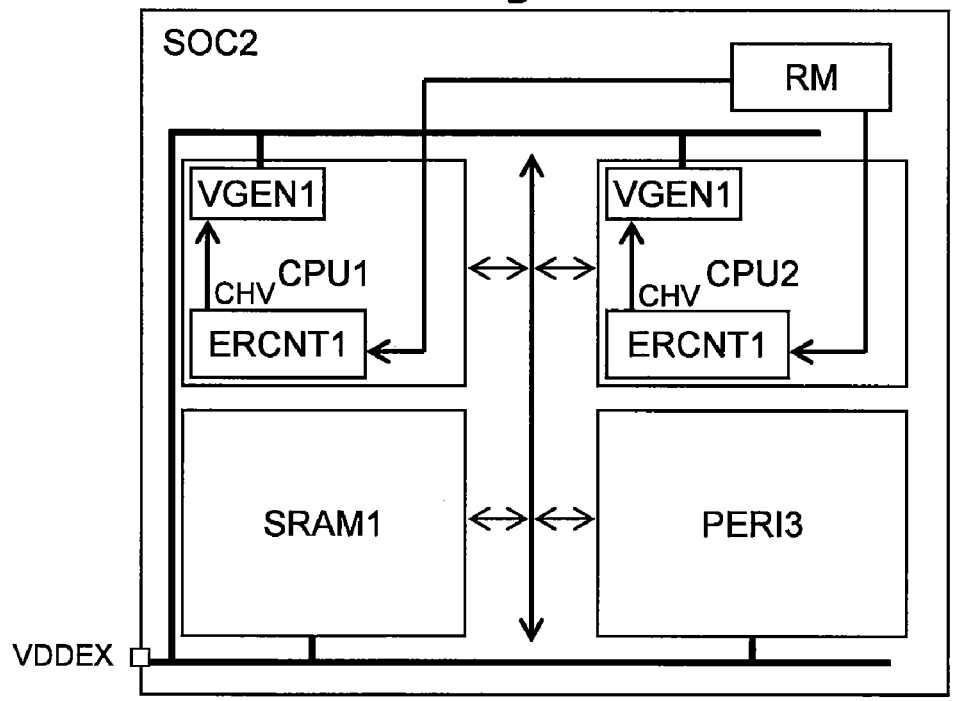
FIG. 9 shows a block diagram of another configuration example of the SOC.

FIG. 9 shows SOC (System On a Chip) 2 as an example of the semiconductor device according to the invention. The SOC2 shown in FIG. 9 is greatly different from SOC1 as shown in FIG. 8 in that it includes two central processing units (CPU1 and CPU2) each of which may perform general-purpose processing, and a resource manager (RM) that manages a resource of each CPU. PERI3 is an accelerator that performs particular processing, and SRAM1 is a static memory block used as a main memory. Each of the CPU1 and CPU2 has special VGEN1 and ERCNT1, and is separately adjusted in power voltage. While not particularly limited, since VGEN1 and ERCNT1 in each of the CPU1 and CPU2 are configured in the same way as in the case of the embodiment 1, detailed description of them is omitted here.

In SOC mounted with a plurality of CPU in this way, a plurality of circuit blocks that limit performance exist in the SOC. In such a case, a circuit for adjusting a resource of each processor is needed. In the example, the RM performs resource adjustment of each of the CPU1 and CPU2. Operation speed of each of CPU1 and CPU2 after such resource adjustment is measured by the special ERCNT1, and a minimum power voltage corresponding to the speed performance is set in the special VGEN1.

In this way, in the embodiment 2, operation speed of each of CPU1 and CPU2 after the resource adjustment is measured by the special ERCNT1, and the minimum power voltage corresponding to the speed performance is set in the special VGEN1, therefore appropriate power voltage setting is performed in accordance with the resource adjustment of each of CPU1 and CPU2.

Embodiment 3

Figure 10:
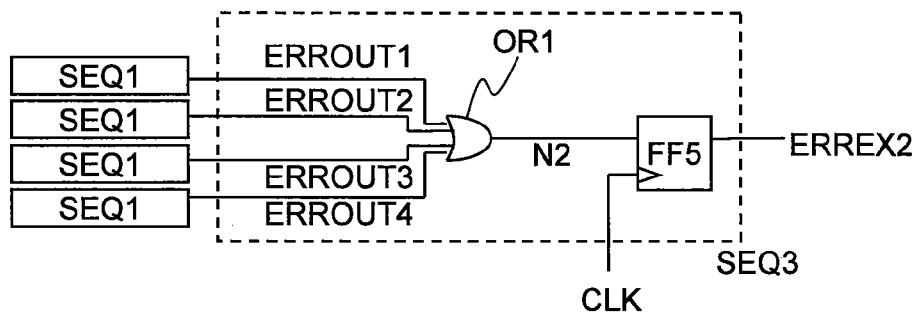
FIG. 10 shows a block diagram of another configuration example of a major part of the SOC.

Typically, SOC has a plurality of paths called critical paths in which speed performance is lowest. In such a case, a plurality of speed performance measurement circuits (SEQ1) are preferably used to measure speed performance. FIG. 10 shows a configuration example of a major part in case that a plurality of SEQ1 are provided in such a way.

In the example shown in FIG. 10, four SEQ1 are provided, and output signals from the SEQ1 are transmitted to a speed performance measurement result output unit (SEQ3) in a subsequent stage respectively. Since the four SEQ1 are configured in the same as that shown in FIG. 1, detailed description of them is omitted here. The SEQ3 is configured as follows.

ERROUT1 to ERROUT4 are output signals from the four SEQ1 respectively. An OR circuit (OR1) is provided, which obtains OR logic between ERROUT1 to ERROUT4. An output signal N2 from OR1 is transmitted to a flip flop circuit (FF5) in a subsequent stage. FF5 holds the output signal N2 from OR1 in synchronization with a clock signal CLK. An output signal ERREX2 from FF5 is supplied as an output signal (error determination signal) from SEQ3 to a circuit in a subsequent stage such as CONTV (refer to FIG. 4).

In this way, according to the configuration shown in FIG. 10, OR logic between ERROUT1 to ERROUT4 is obtained by OR1. Therefore, when even one of ERROUT1 to ERROUT4 is turned to a high level, the output signal N2 from the OR1 is accordingly turned to a high level. Such a signal is stored in FF5 at rising of the clock signal CLK, and outputted as ERREX2. That is, according to the example, a high-level output signal can be detected from output of a plurality of circuits that measure speed performance respectively. Therefore, when the signal ERREX2 is used to adjust circuit performance, a minimum power voltage to secure predetermined circuit performance can be set in SOC.

Embodiment 4

Figure 11:
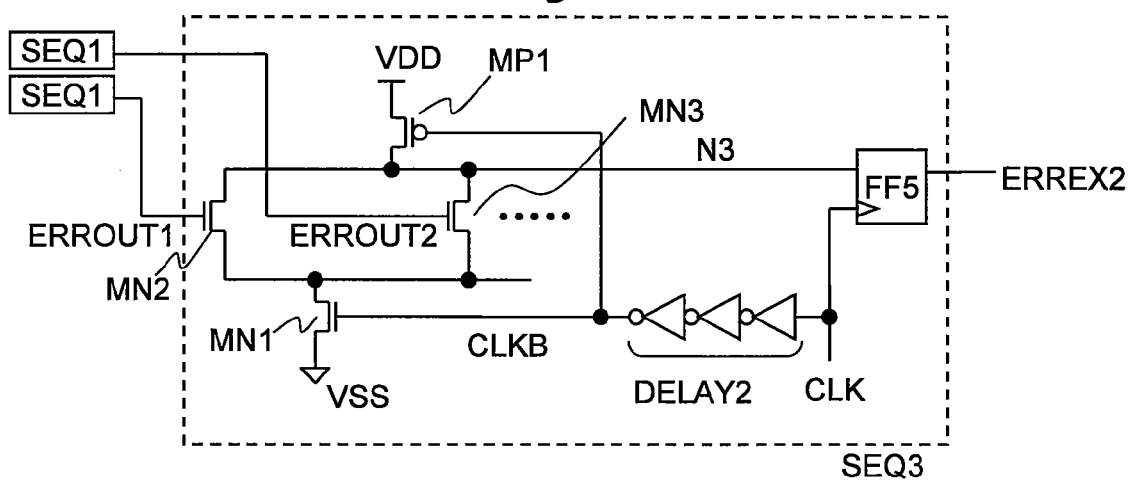
FIG. 11 shows a block diagram of still another configuration example of the major part of the SOC.

FIG. 11 shows another configuration example of a major part in case that a plurality of SEQ1 are provided.

In the example shown in FIG. 11, two SEQ1 are provided, and output signals from the SEQ1 are transmitted to a speed performance measurement result output unit (SEQ3) in a subsequent stage respectively. Since the two SEQ1 are configured in the same way as SEQ1 shown in FIG. 1, detailed description of them is omitted here. In FIG. 11, SEQ3 is configured as follows.

MP1 is a p-channel MOS transistor for precharging a node N3 to a high level (power VDD level at a high potential side), MN2 and MN3 are n-channel MOS transistors for loading the ERROUT1 and ERROUT2 respectively, MN1 is an n-channel MOS transistor for pulling down a source electrode of each of the MN2 and MN3 to a low level (power VSS level at a low potential side). In addition, a delay circuit (DELAY2) formed by a plurality of inverters is provided, which delays a clock signal CLK. A clock signal CLKB delayed by the DELAY2 is supplied to each of gate electrodes of the p-channel MOS transistor MP1 and the n-channel MOS transistor MN1.

Figure 12:
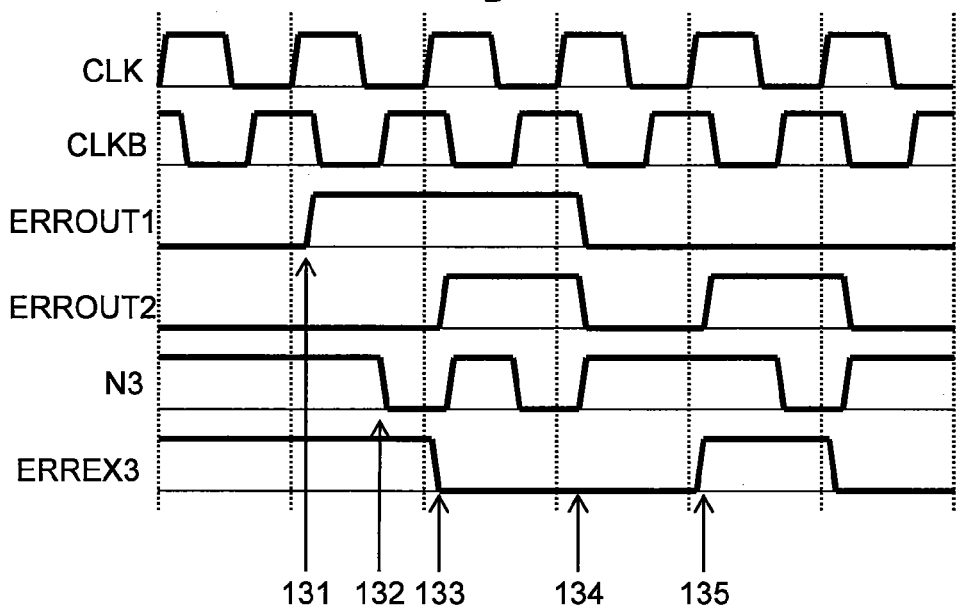
FIG. 12 shows operation timing of a major part of the configuration shown in FIG. 11.

FIG. 12 shows operation timing of a major part of the configuration shown in FIG. 11.

A circuit shown in FIG. 12 is inputted with a cyclical clock signal CLK. At time 131, speed error occurs, and ERROUT1 is turned to a high level. Then, the n-channel MOS transistor MN2 is turned on. At time 132, the clock signal CLKB is turned to a high level, thereby the n-channel MOS transistor MN1 is turned on, and thereby the node N3 is turned to a low level. At time 133, the clock signal CLK is inputted into FF5, and thus low-level data are stored into FF5, and the stored data are outputted as ERREX3. When ERREX3 has a high level, it shows a state without speed error, and when ERREX3 has a low level, it shows a state with speed error. At time 134, either of the inputted signals ERROUT1 and ERROUT2 is turned to a low level, and therefore the node N3 is not discharged, and at time 135 being next cycle start time, high-level data are stored into FF3, and the stored data are outputted.

In FIG. 11, two SEQ1 are provided, and output signals from the two SEQ1 are transmitted to the speed performance measurement result output unit (SEQ3) in the subsequent stage respectively. However, the configuration may be made such that three SEQ1 are provided, and output signals from the three SEQ1 are transmitted to SEQ3 respectively. Moreover, while an output signal (such as ERROUT1) from FF3 is loaded as an output signal from SEQ1 in FIGS. 10 and 11, an output signal from EXOR1 may be loaded. In this case, FF3 in the plurality of SEQ1 are unnecessary.

The configuration shown in each of FIGS. 10 and 11, which shows a circuit obtaining logic sum of a plurality of signals, is suitable for a case that a plurality of critical paths exist in a circuit, and a plurality of circuits of FIG. 1 are mounted. The circuit shown in FIG. 10 is available up to about four signals. However, the number of signals further increases, which causes increase in number of wirings and in circuit scale, leading to difficulty in use of the circuit. On the other hand, in the circuit shown in FIG. 11, when the number of inputted signals increases, a MOS transistor corresponding to the n-channel MOS transistor MN2 or MN3 can be merely added, therefore increase in circuit scale can be suppressed.

Embodiment 5

Figure 13:
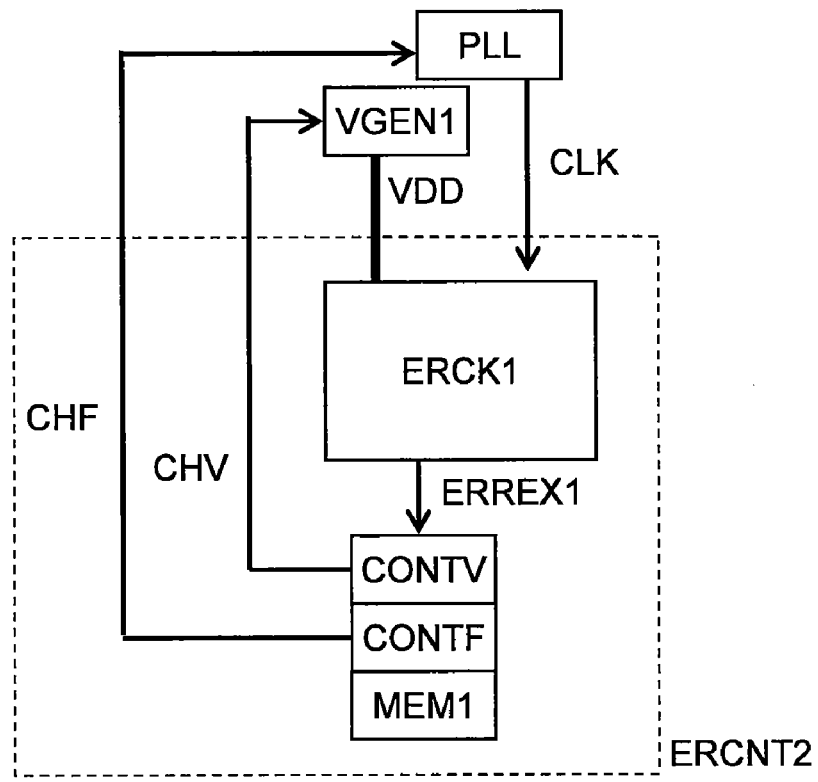
FIG. 13 shows a block diagram of another configuration example of a major part of SOC as an example of a semiconductor device according to the invention.

In recent SOC, a technique of FV control is generally known, in which each of frequency and power voltage of a clock signal is changed, so that required operation performance is secured, in addition, power voltage is decreased, thereby power consumption is reduced. A circuit technology of the embodiment enables measurement of a minimum power voltage required for operation at a particular frequency. Therefore, when the circuit technology is used, a power voltage can be set to the minimum voltage in FV control, and consequently low power consumption can be achieved in SOC. FIG. 13 shows a configuration example in such a case.

ERCNT1 shown in FIG. 13 is greatly different from that shown in FIG. 4 in that an operation frequency control circuit (CONTF) is provided, and the CONTF controls operation of PLL (Phase Locked Loop).

In FIG. 13, VGEN1 is a power voltage generator, PLL is a clock generation circuit that generates a clock signal CLK, CONTV is a power voltage control circuit, CONTF is a frequency control circuit that controls frequency of the clock signal CLK, MEM1 is a memory circuit for storing power voltage or control information of frequency of the clock signal CLK. VDD is power at a high potential side, CLK is the clock signal, CHV is a signal specifying the power voltage, CHF is a signal specifying operation frequency, and ERROUT is an output signal from a circuit measuring speed performance.

In the circuit, an operable, minimum power voltage can be set by ERREX1 outputted from ERCK1 as in the case shown in FIG. 4. Furthermore, in the circuit, adjustment of the clock signal CLK is additionally performed.

Figure 14:
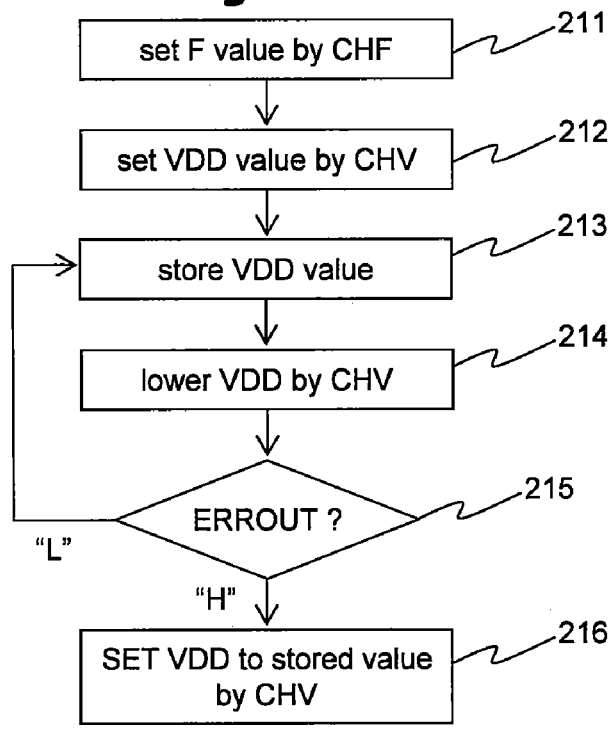
FIG. 14 shows a flowchart showing an operation sequence of the configuration shown in FIG. 13.

FIG. 14 shows flow of operation of the configuration shown in FIG. 13.

In step 211, frequency of a clock generated by the clock generation circuit is set to a value required for circuit operation. In step 212, a control signal CHV is transmitted from CONTV to VGEN1 so as to generate a predetermined power voltage, so that a power voltage is set. In step 213, a current power voltage value is stored in MEM1 in FIG. 13, and in step 214, a signal is transmitted from CONTV to VGEN1 so as to generate a power voltage lowered by several millivolts to tens of millivolts from a value of the power voltage stored in the step 213, so that control information of power voltage is set. In step 215, determination is made on whether data outputted from ERROUT have a high level. In the determination, in case that the data outputted from ERROUT is determined to have a high level, operation of step 216 is performed. On the other hand, in case that the data outputted from ERROUT is determined to have a low level, operation is returned to the step 213. In the step 216, power voltage is adjusted according to the control information stored in MEM 2. Operation from steps 211 to 216 is performed, enabling setting of an operable, minimum power voltage of a circuit at a predetermined operation speed.

Embodiment 6

Figure 24:
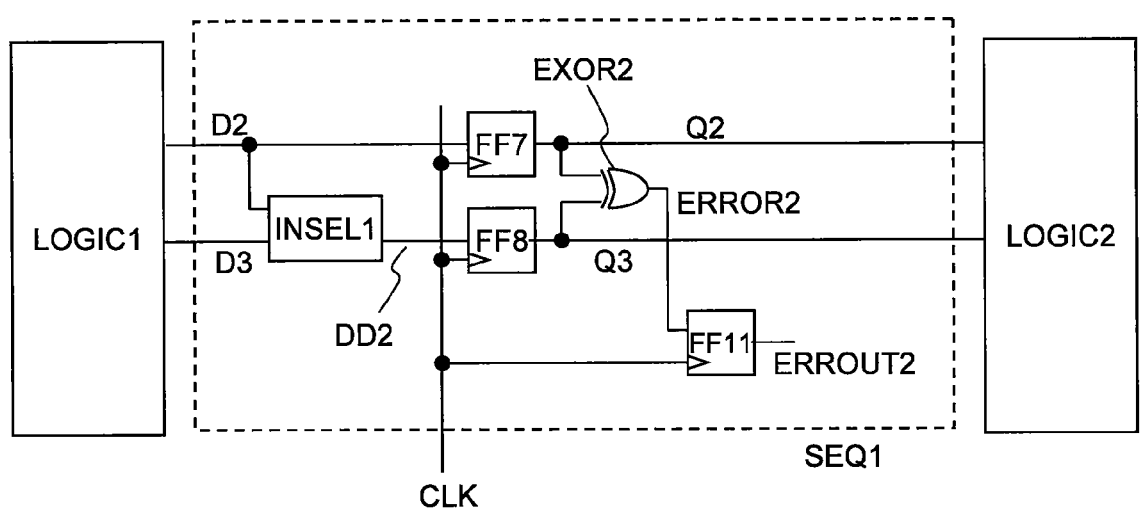
FIG. 24 shows a circuit diagram of still another configuration example of the major part of the SOC.

FIG. 24 shows another configuration example of the SEQ1.

SEQ1 shown in FIG. 24 is disposed between LOGIC1 and LOGIC2 in the same way as SEQ1 shown in FIG. 1. In FIG. 24, FF7 and FF8 are flip flops with scan function, D2 and D3 are data to be inputted into FF7 and FF8, and Q2 and Q3 are signals to be outputted from FF7 and FF8, respectively. CLK is a clock signal. EXOR2 shows a logic circuit obtaining exclusive-OR. ERROR2 shows a result of obtaining exclusive-OR between the output signals Q2 and Q3. FF11 is a flip flop for holding ERROR2 in synchronization with the clock signal CLK. Output of FF11 is shown as ERROUT2. INSEL1 is a selection circuit for selectively transmitting the inputted signals D2 and D3 to a circuit in a subsequent stage.

Figure 15:
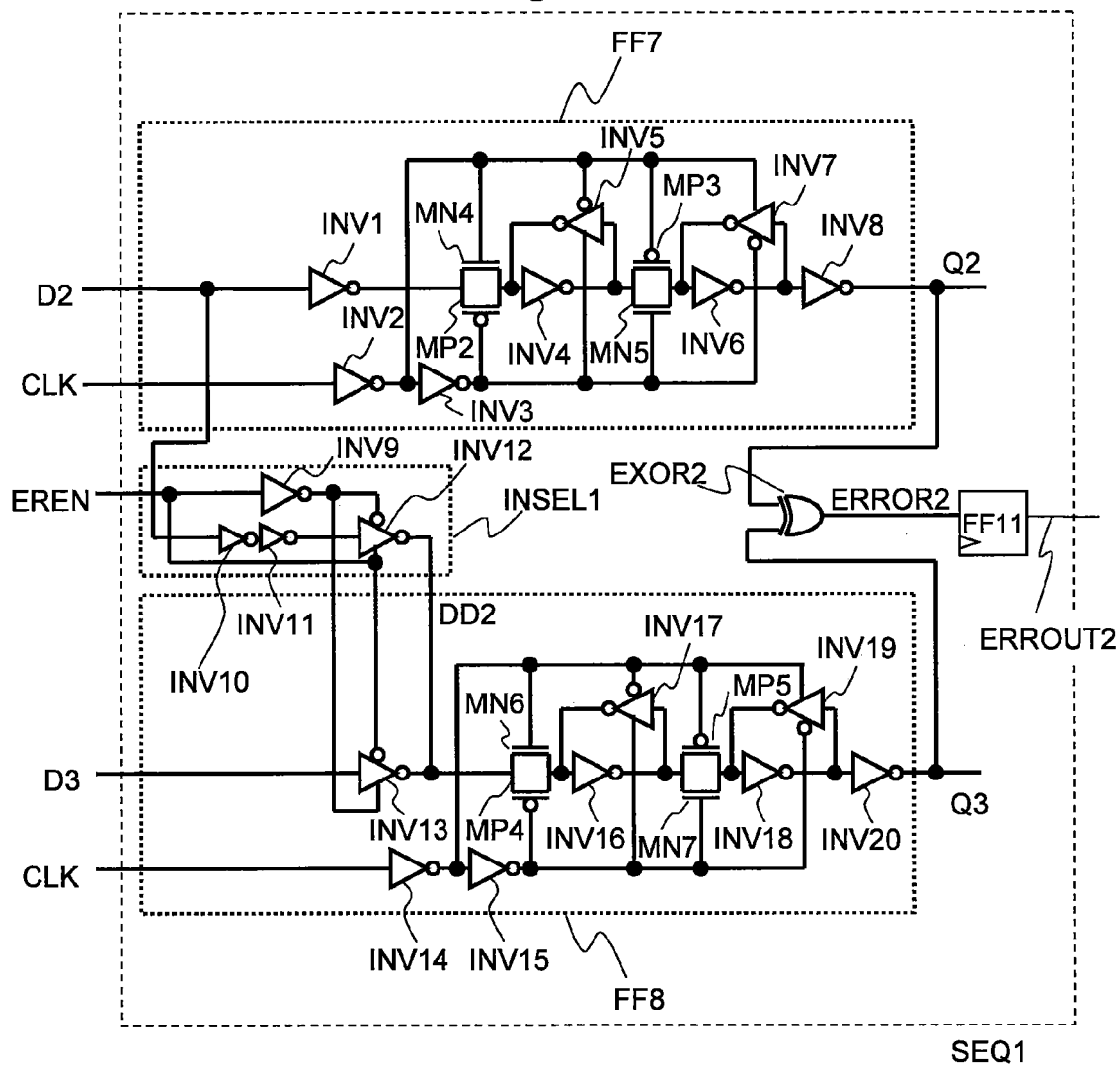
FIG. 15 shows a circuit diagram of a detailed configuration example of a major part in FIG. 24.

FIG. 15 shows a detailed configuration example of a major part in FIG. 24.

The FF7 includes inverters INV1, INV2, INV3, INV4 and INV6, clocked inverters INV5 and INV7, n-channel MOS transistors MN4 and MN5, and p-channel MOS transistors MP2 and MP3. The n-channel MOS transistor MN4 and the p-channel MOS transistor MP2 are connected in parallel, thereby a transfer gate is formed. The n-channel MOS transistor MN5 and the p-channel MOS transistor MP3 are connected in parallel, thereby another transfer gate is formed. The inverter INV4 and the clocked inverter INV5 are connected in parallel, thereby a latch circuit is formed, and the inverter INV6 and the clocked inverter INV7 are connected in parallel, thereby another latch circuit is formed. D2 is held by the inverter INV4 and the clocked inverter INV5 via the inverter INV1 and the MOS transistors MN4 and MP2, and furthermore, held by the inverter INV6 and the clocked inverter INV7 via the MOS transistors MP3 and MN5. A value of the held D2 is outputted as Q2 via the inverter INV8. The clock signal CLK is supplied to the p-channel MOS transistor MP2, clocked inverter INV5, n-channel MOS transistor MN5 and clocked inverter INV7 via the inverters INV2 and INV3, thereby D2 is outputted as Q2 in two cycles in synchronization with the clock signal CLK.

The FF8 includes clocked inverters INV13, INV17 and INV19, inverters INV14, INV16, INV18 and INV20, n-channel MOS transistors MN6 and MN7, and p-channel MOS transistors MP4 and MP5, and is configured in the same way as FF7.

The INSEL1 includes inverters INV9, INV10 and INV11, and a clocked inverter INV12.

The circuit has two FF, in which EREN is turned to a high level, thereby the inputted data D2 is compared to data of a signal formed by delaying D2 by time corresponding to two stages of inverters, so that speed error in a path inputted with D2 can be detected. In case that SOC including the circuit performs normal operation, each of FF7 and FF8 is within a path of the circuit, and used as a part of operation circuit. In case that SOC including the circuit is transferred into a mode of measuring operation performance, FF8 is used as a flip flop for comparison with data in FF7.

FIGS. 16 and 17 show operation timing of a major part of the circuit shown in FIG. 15.

In a period when a level of EREN is a low level, that is, in a period being not shown as COMP1 in FIGS. 16 and 17, data inputted through D2 are stored into FF7 at rising of the clock signal CLK, and the stored data are outputted through the data output Q2. Data inputted through D3 are stored into FF8 at rising of the clock signal CLK, and the stored data are outputted through the data output Q3.

Each of INV10 and INV11 operates as a delay circuit that delays D2 by time corresponding to two stages of inverters. In case that EREN is turned to a high level, in FIG. 15, a signal inputted into FF8 is switched from D3 to a signal given by delaying D2 by time corresponding to two stages of inverters by the circuits of INSEL1 and INSEL2. In case that delay given by adding delay of two stages of inverters to delay in a path of a signal inputted into D2 is shorter than delay provided by a cycle of the clock signal CLK (FIG. 16), the same data are stored into FF7 and FF8. This is shown as a period shown by COMP1 in FIG. 16. In this period, a level of EREN is a high level, and furthermore, either of Q2 and Q3 being output of FF7 and FF8 has DAT13 or DAT14, which shows that the same data are stored. Accordingly, low-level data are outputted through ERROR2 as a result of obtaining exclusive-OR between the two data.

In case that delay given by adding delay of two stages of inverters to delay in a path of a signal inputted into D2 is longer than delay provided by a cycle of the clock signal CLK (FIG. 17), data in FF7 in a prior cycle are stored into FF8. This is shown as a period shown by COMP1 in FIG. 17. In this period, a level of EREN is a high level, and furthermore, Q2 and Q3 being output of FF7 and FF8 have DAT13 and DAT12, and DAT14 and DAT13 respectively, that is, each FF stores different data. Accordingly, high-level data are outputted through ERROR2 as a result of obtaining exclusive-OR between the two data. Since the output signal ERROR2 is outputted in the same condition as the output signal ERROR in FIG. 1, the circuit is used in the same way as the case of the embodiment 1, thereby speed error in the circuit can be detected.

FIG. 18 shows a sequence of measuring operation speed by using the circuit to set power voltage.

In the circuit, in case that the circuit performs normal operation, FF8 is within a normal operation path. Therefore, in case that the circuit is used to measure operation speed, since FF8 may not perform normal operation, operation needs to be changed from the normal operation. In addition, the same circuit as shown in FIG. 4 may be used as a circuit for setting power voltage.

In FIG. 18, in step 221, a mode is shifted to a test mode. That is, in the circuit of FIG. 15, when EREN is inputted with a high level signal, input of FF8 is switched to D2, so that a mode is shifted to the test mode. In step 222, power voltage is set. That is, a signal is transmitted from CONTV to VGEN1 so as to generate a predetermined power voltage, thereby power voltage is set. In step 223, a current power voltage value VDD is stored in MEM1 in FIG. 4. In step 224, the power voltage VDD is lowered. That is, a signal is transmitted from CONTV to VGEN1 so as to generate a power voltage lower than a value of the power voltage stored in the step 223 by several millivolts to tens of millivolts, thereby the power voltage VDD is set. In step 225, data outputted through ERROUT2 is subjected to comparison. In case that a high level is outputted, operation of step 226 is performed. In case that a low level is outputted as a result of the comparison, operation is shifted to operation of the step 223. In step 226, power voltage is set to the value stored in MEM1 in FIG. 4, and setting is finished. In step 227, the test mode is shifted from the test mode to a normal operation mode, and in the circuit of FIG. 15, EREN is turned to a low level, thereby input of FF8 is switched from D2 to D3, so that the test mode is shifted to the normal operation mode. Operation from steps 211 to 216 is performed, enabling setting of an operable, minimum power voltage of a circuit at predetermined operation speed.

In this way, the switching circuit (INSEL1) is used, thereby FF used for normal operation may be used for error determination. Therefore, area overhead can be reduced. Thus, even in VLSI having many critical paths such as SOC, optimization of operation voltage can be achieved without increasing area, and consequently the above problem (4) can be solved.

Embodiment 7

Figure 19:
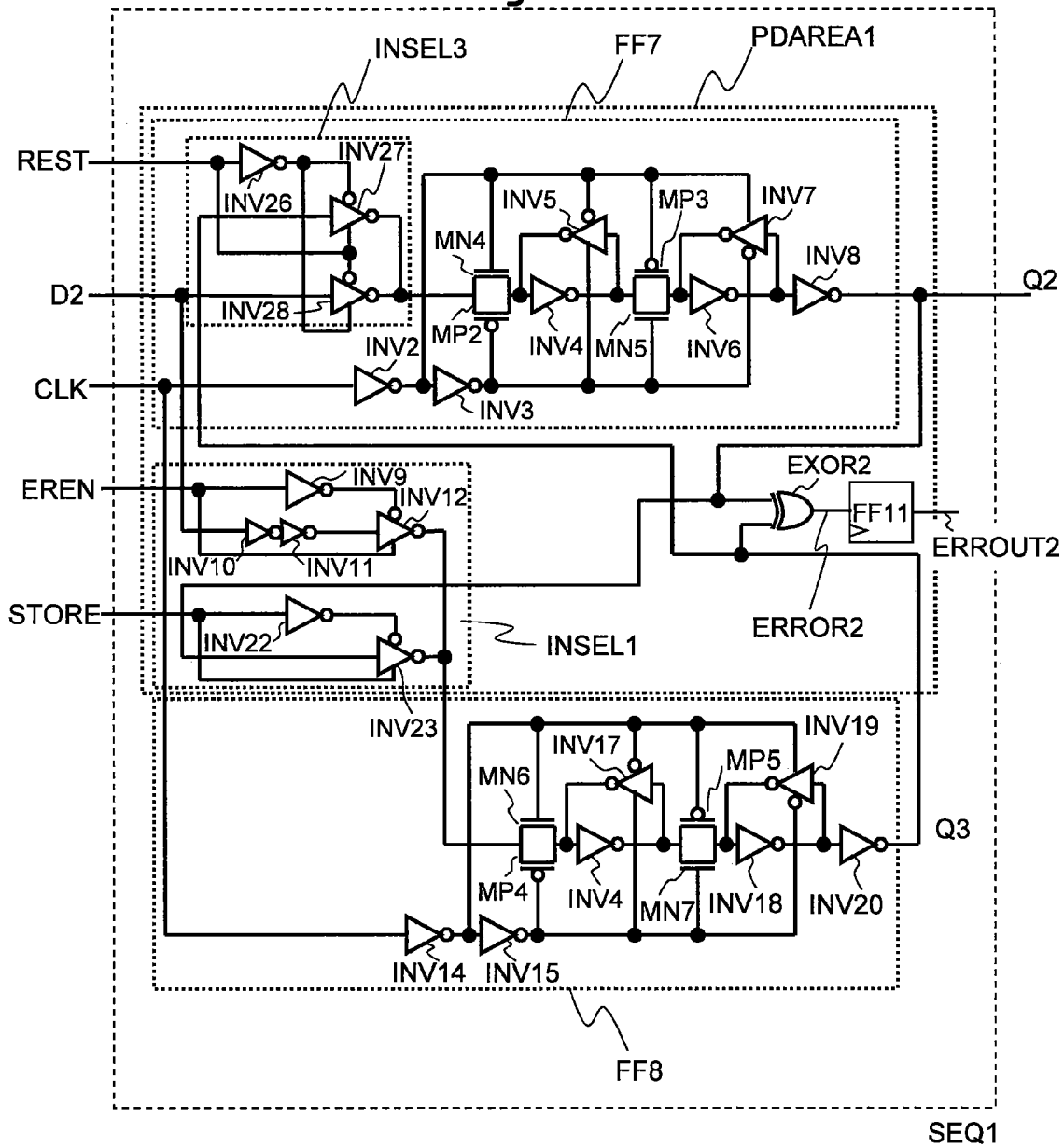
FIG. 19 shows a circuit diagram of another configuration example of the major part of the SOC.

FIG. 19 shows another configuration example of the SEQ1.

SEQ1 shown in FIG. 19 is disposed between LOGIC1 and LOGIC2 in the same way as SEQ1 shown in FIG. 1 or FIG. 15. SEQ1 shown in FIG. 19 is greatly different from SEQ1 shown in FIG. 15 is in that a selection circuit (INSEL3) is provided for selectively loading the output signal Q3 from FF8 into FF7, and a circuit is provided in INSEL1 for selectively transmitting a store signal (STORE) and an output signal from FF7 to FF8. The INSEL3 includes INV26, INV27 and INV28. The circuit for selectively transmitting the store signal (STORE) and the output signal from FF7 to FF8 includes an inverter 22 and a clocked inverter 23.

In FIG. 19, FF9 shows a flip flop that stores inputted data D2, and outputs the data as Q2 upon a clock signal CLK. Here, FF10 operates as a balloon latch, which may store the data stored in FF9 according to STORE, and may write previously stored data into FF9 according to a reset signal (REST) Typically, FF9 and FF8 are handled in pair, and in case that a logic circuit including the flip flops is into a standby state, a region enclosed by PDAREA1 including FF9 is broken in power, and power is supplied to only a portion of FF10. Thus, a leakage current of a circuit in PDAREA1 is reduced, so that power consumption of a logic circuit can be reduced during standby, in addition, since data are stored in the flip flop, recovery time from the standby state is reduced. ERROR2 shows a result of obtaining exclusive-OR between the signals Q2 and Q3. INSEL3 and INSEL1 are selection circuits for selecting signals to be inputted into FF9 and FF10 respectively.

In the circuit, EREN is turned to a high level, thereby the inputted data D2 is compared to data of a signal given by delaying D2 by time corresponding to two stages of inverters, speed error in a path to be inputted with D2 can be detected.

Figure 20:
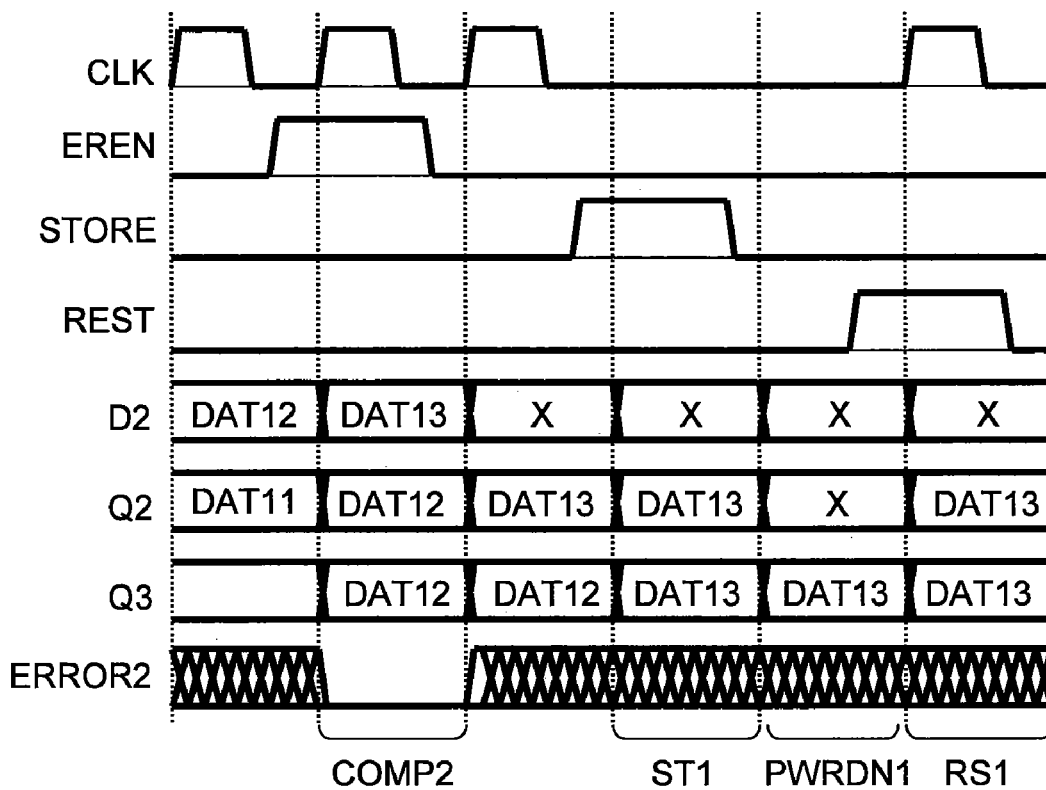
FIG. 20 shows an operation timing chart of a major part of the circuit shown in FIG. 19.
Figure 21:
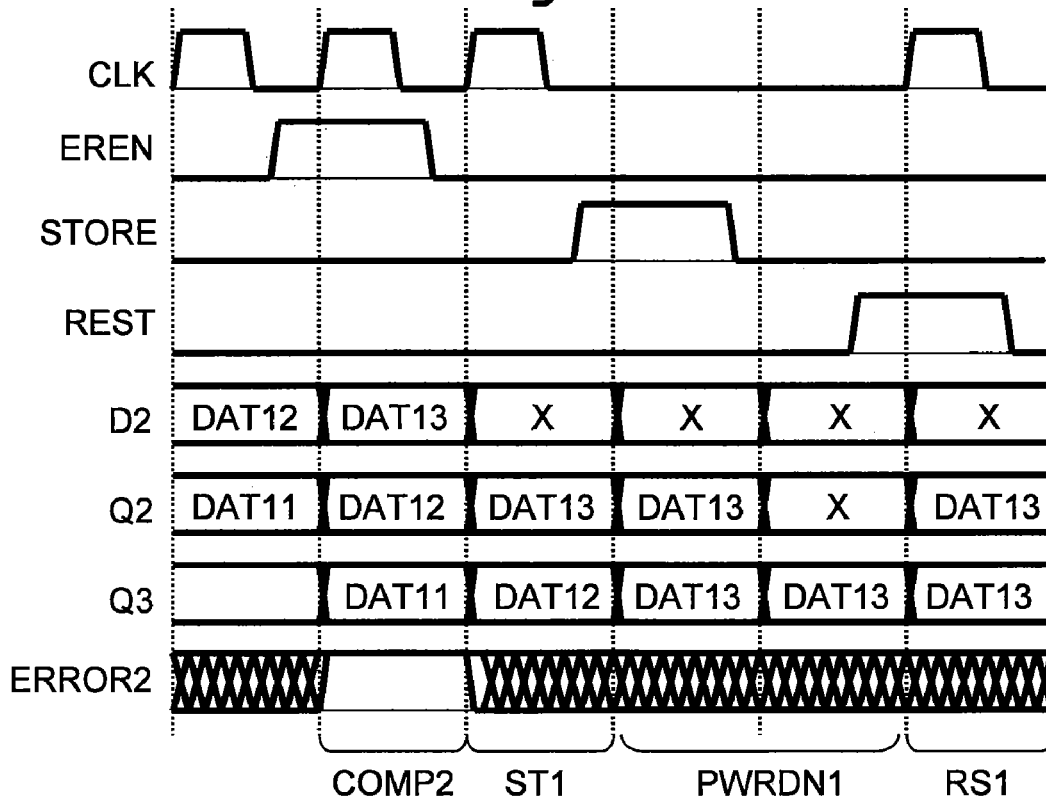
FIG. 21 shows another operation timing chart of the major part of the circuit shown in FIG. 19.

FIGS. 20 and 21 show operation timing of a major part of the circuit shown in FIG. 19.

In case that EREN is turned to a high level, thereby in case that a high-level signal is inputted, in FIG. 19, INSEL1 switches an input signal into FF10 to a signal given by delaying D2 by time corresponding to two stages of inverters. In case that delay given by adding delay of two stages of inverters to delay in a path of a signal inputted as D2 is shorter than delay provided by a cycle of the clock signal CLK (refer to FIG. 20), the same data are stored into FF9 and FF10. This is shown as a period shown by COMP2 in FIG. 20. In this period, a level of EREN is a high level, and furthermore, either of Q2 and Q3 being output of FF9 and FF10 has DAT12, which shows that the same data are stored. Accordingly, low-level data are outputted as ERROR2 as a result of obtaining exclusive-OR between the two data.

In case that delay given by adding delay of two stages of inverters to delay in a path of a signal inputted as D2 is longer than delay provided by a cycle of the clock signal CLK (refer to FIG. 21), data in FF9 in a prior cycle are stored into FF10. This is shown as a period shown by COMP2 in FIG. 21. In this period, EREN is "H", and furthermore, Q4 and Q5 being output of FF9 and FF10 have DAT12 and DAT11 respectively, that is, each FF stores different data. Accordingly, high-level data are outputted as ERROR2 as a result of obtaining exclusive-OR between the two data. Since the output signal ERROR2 is outputted in the same condition as the output signal ERROR in FIG. 1, speed error in the circuit can be detected as the case of the embodiment 1.

In addition, in the circuit, data stored in FF9 may be held in FF10 by using STORE and REST, and furthermore the data may be returned into FF9. In FIG. 19, when STORE is turned to a high level, Q4 being output of FF9 is connected to input of FF10, and the data in FF9 is written into FF10 upon input of a subsequent clock signal CLK. Such a state can be confirmed from a fact that data DAT13 in FF9 in a prior cycle of ST1 are written into FF10 in a cycle of ST1 in FIG. 20. In FIG. 20, a period of PWRDN1 shows that a logic circuit including the circuit of the invention is in a standby state, in which power is broken in a region within PDAREA1 in FIG. 19, and power is supplied to only a circuit of FF10, so that leakage current of the entire circuit is reduced, leading to low power consumption. While only one cycle is shown in the waveform diagram, the standby state where power is broken actually continues at least 100 cycles in many cases. Then, a state is returned from the standby state to the normal state, and power is supplied to the circuit within PDAREA1, and then a REST signal is inputted. Thus, the data stored in FF10 is rewritten into FF9.

As hereinbefore, in the embodiment, FF10 is used for operation for holding data in a low leakage condition during standby of a logic circuit, and FF10 is used for measuring speed in a logic path up to D2 during a normal operation condition. Therefore, low leakage current operation and speed adjustment operation can be performed while suppressing increase in area of a flip flop. That is, according to the embodiment, while speed performance required in SOC is secured, a minimum power voltage can be set.

Even in the configuration, the switching circuit (INSEL1) is used, thereby FF having a different function (data holding function during standby) may be used even for error determination. Therefore, area overhead can be reduced. Thus, even in VLSI having many critical paths such as SOC, optimization of operation voltage can be achieved without increasing area, and consequently the above problem (4) can be solved.

Embodiment 8

Figure 22:
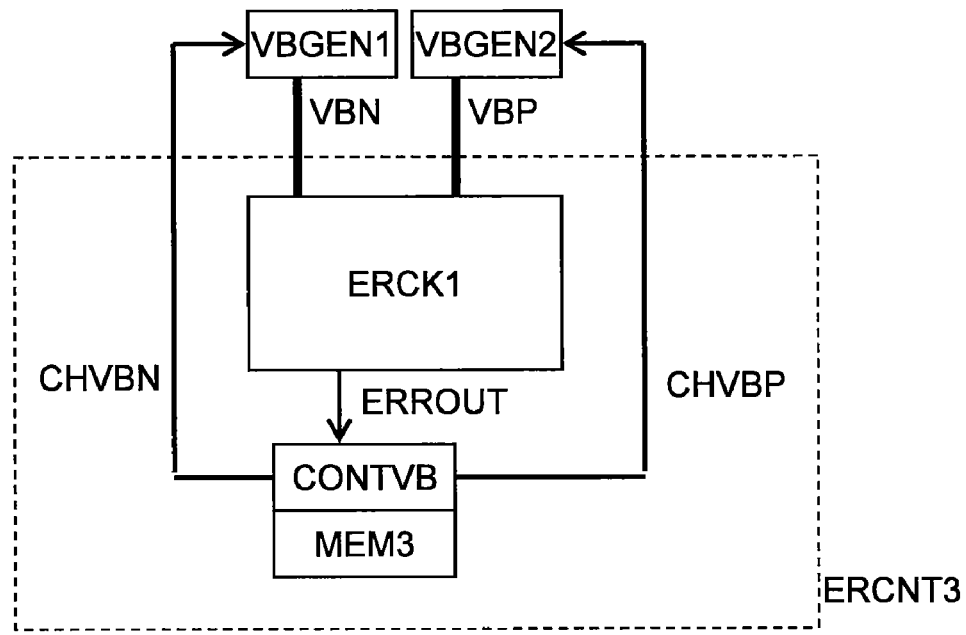
FIG. 22 shows a block diagram of a configuration example of a body bias control system in the SOC.

FIG. 22 shows a body bias control system in the SOC (System On a Chip).

Generally, body bias being backgate potential of a MOS transistor is controlled, thereby performance of the transistor can be changed. In addition, as a value of VBN being body bias of an n-channel MOS transistor is decreased, operation speed is decreased, but a leakage current flowing through the MOS transistor is decreased, and thus power consumption can be reduced. Moreover, as a value of VBP being body bias of a p-channel MOS transistor is decreased, operation speed is decreased, but a leakage current flowing through the MOS transistor is decreased, and thus power consumption can be reduced. In the embodiment, change in speed is measured, and thereby desired operation speed is obtained, through which optimum body bias is determined.

In FIG. 22, VBGEN1 is a body bias generation circuit that generates VBN being body bias of an n-channel MOS transistor, VBGEN2 is a body bias generation circuit that generates VBP being body bias of a p-channel MOS transistor, and ERCNT3 is a body bias control circuit that may control body bias. CONTVB is a body bias control circuit, and MEM3 is a memory circuit that stores a value of body bias. ERCK1 is a circuit that measures speed performance of a circuit, and a configuration thereof is the same as that shown in FIG. 1. CHVBN is a signal that specifies VBN being body bias of an n-channel MOS transistor, CHVBP is a signal that specifies VBP being body bias of a p-channel MOS transistor, ERROUT is an output signal from the circuit measuring speed performance. In the circuit, the ERROUT signal outputted from the circuit measuring speed performance is used to control a value of VBN to a minimum, and a value of VBP to a maximum, so that reduction in power consumption can be achieved while satisfying required operation speed.

Figure 23:
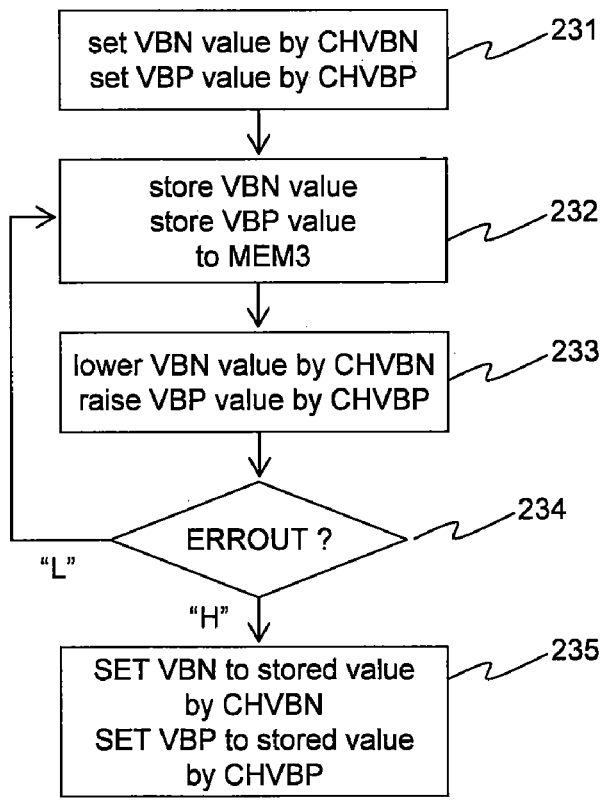
FIG. 23 shows a flowchart showing a sequence of setting of body bias using the circuit shown in FIG. 22.

FIG. 23 shows a sequence of setting of body bias by using the circuit shown in FIG. 22.

In FIG. 23, in step 231, a value of each of VBN and VBP is set to an initial value, and control signals CHVBN and CHVBP are transmitted from the body bias control circuit (CONTVB) to the body bias generation circuits (VBGEN1 and VBGEN2) so as to generate predetermined body bias, so that bias voltage is set. In step 232, a current body bias value (control information) is stored into MEM3 in FIG. 22. The body bias control circuit controls bias voltage in accordance with the value (control information) of body bias in MEM3. In step 233, body bias is changed. That is, a signal is transmitted from the body bias control circuit (CONTVB) to the body bias generation circuit (VBGEN1) so as to set a value of VBN to a value decreased by tens of millvolts to hundreds of millvolts from the value stored in the step 232, so that VBN is set. Concurrently, a signal is transmitted from the body bias control circuit (CONTVB) to the body bias generation circuit (VBGEN2) so as to set a value of VBP to a value increased by tens of millvolts to hundreds of millvolts from the value stored in the step 232, so that VBP is set. In step 234, data outputted through ERROUT is subjected to comparison. In case that a high level signal is outputted, operation of step 235 is performed. In case that a low level signal is outputted, operation of the step 232 is performed. In step 235, the body bias values VBN and VBP are set to the values stored in MEM3 respectively. Operation from steps 231 to 235 is performed, thereby power consumption can be minimized under a condition that a circuit operates at a predetermined operation speed.

In SOC, a technique of FV control is generally known, in which each of frequency and power voltage is changed, so that required operation performance is secured, in addition, power voltage is decreased, thereby power consumption is reduced. The circuit technology is further effective by being combined with the FV control. In addition, when the technology is further combined with the circuit of embodiment 5, further reduction in power consumption of SOC can be made.

As hereinbefore, according to the embodiment, while speed performance required in LSI is secured, the minimum power voltage can be set.

Hereinbefore, the invention made by the inventor has been specifically described. However, the invention is not limited to that, and it will be appreciated that the invention can be variously altered or modified without departing from the gist of the invention.

In the above description, the invention made by the inventor was described mainly on a case that the invention is applied to SOC being a field as a background of the invention. However, the invention is not limited to that, and may be widely applied to various semiconductor devices.

What is claimed is:

1. A semiconductor device comprising:
    a first logic circuit;
    a second logic circuit disposed in a subsequent stage of the first logic circuit and transmitted with first data outputted from the first logic circuit; and
    a speed performance measurement circuit disposed between the first logic circuit and the second logic circuit and performing speed performance measurement;
    wherein the speed performance measurement circuit includes
        a first flip flop that stores the first data in synchronization with a clock signal;
        a first delay circuit that delays the first data and generates second data;
        a second flip flop that stores the second data in synchronization with the clock signal;
        a comparator circuit that compares an output of the first flip flop with an output of the second flip flop;
        a third flip flop that stores data of an output signal from the comparator circuit in accordance with timing of the clock signal; and
        a fourth flip flop,
            wherein when an output logic state of the comparator circuit is a high level, the fourth flip flop keeps an output state at a high level until receiving a reset signal.

2. The semiconductor device according to claim 1, further comprising:
    a voltage generating circuit generating a power voltage for operation of the first and second logic circuits, and
    a voltage control circuit adjusting the power voltage by using output data from the comparator circuit.

3. The semiconductor device according to claim 2, further comprising:
    a memory circuit holding control information of the power voltage;
    wherein the voltage control circuit refers to the control information in the memory circuit for adjusting the power voltage.

4. The semiconductor device according to claim 2, further comprising:
    a resource manager for managing a resource of a circuit module having a predetermined function,
    wherein the power voltage is adjusted depending on resource management of the circuit module performed by the resource manager.

5. The semiconductor device according to claim 1:
    wherein when a plurality of the speed performance measurement circuits are provided, a speed-performance-measurement-result-output-unit is provided for collecting output signals from the plurality of speed performance measurement circuits into one signal, and
    the speed-performance-measurement-result-output-unit includes an OR circuit for collecting output signals from the plurality of speed performance measurement circuits into one signal by obtaining OR logic between the output signals from the plurality of speed performance measurement circuits, and a fifth flip flop circuit for holding an output signal from the OR circuit in synchronization with the clock signal.

6. The semiconductor device according to claim 1:
    wherein when a plurality of the speed performance measurement circuits are provided, a speed performance measurement result output unit is provided for collecting output signals from the plurality of speed performance measurement circuits into one signal, and
    the speed performance measurement result output unit includes:
        a second delay circuit for delaying the clock signal,
        a plurality of first transistors that are disposed corresponding to the plurality of speed performance measurement circuits, and load output signals from the respective, corresponding speed performance measurement circuits,
        a second MOS transistor that is controlled in operation by an output signal from the delay circuit, and couples drain electrodes of the plurality of first transistors to a power supply at a high potential side,
        a third MOS transistor that is controlled in operation by an output signal from the second delay circuit, and couples source electrodes of the plurality of first transistors to a power supply at a low potential side, and
        a sixth flip flop circuit that may hold logic of the drain electrodes of the plurality of first transistors in synchronization with the clock signal.

7. The semiconductor device according to claim 1, further comprising:
    a frequency control circuit controlling frequency of the clock signal based on output data from the comparator circuit.

8. The semiconductor device according to claim 7, further comprising:
    a clock generation circuit that generates the clock signal and changes a frequency of the clock signal based on an output signal from the frequency control circuit.

9. The semiconductor device according to claim 1, further comprising:

a body bias adjustment circuit adjusting body bias of a transistor by using output data from the comparator circuit.

10. The semiconductor device according to claim 9, further comprising:

a memory circuit holding control information of body bias, wherein the body bias adjustment circuit refers to the control information in the memory circuit for adjusting body bias of the transistor.

11. A semiconductor device comprising:

a first flip flop storing inputted, first data in synchronization with timing of a clock signal;

a first delay circuit delaying the first data and outputting the delayed data as second data;

a first selection circuit selectively outputting the second data and output of the first flip flop;

a second flip flop storing an output signal from the first selection circuit in accordance with timing of the clock signal;

a comparator circuit comparing output of the first flip flop with output of the second flip flop; and a second selection circuit inputting data in the second flip flop into the first flip flop.

12. The semiconductor device according to claim 11:

wherein in a standby state, power supply for the first flip flop, the third delay circuit, the second selection circuit, and the comparator circuit is shut off, and a power supply voltage is supplied to the second flip flop.

* * * * *